(12) United States Patent
Miyamoto et al.

(10) Patent No.: US 9,057,873 B2
(45) Date of Patent: Jun. 16, 2015

(54) GLOBAL ALIGNMENT USING MULTIPLE ALIGNMENT PATTERN CANDIDATES

(75) Inventors: Atsushi Miyamoto, Yokohama (JP); Naoki Hosoya, Tokyo (JP); Toshikazu Kawahara, Hitachinaka (JP); Akihiro Onizawa, Mito (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 63 days.

(21) Appl. No.: 13/988,547

(22) PCT Filed: Nov. 22, 2011

(86) PCT No.: PCT/JP2011/076844
§ 371 (c)(1),
(2), (4) Date: May 21, 2013

(87) PCT Pub. No.: WO2012/070549
PCT Pub. Date: May 31, 2012

(65) Prior Publication Data
US 2013/0234019 A1    Sep. 12, 2013

(30) Foreign Application Priority Data

Nov. 24, 2010 (JP) .................... 2010-261157

(51) Int. Cl.
*G06K 9/00* (2006.01)
*G02B 21/00* (2006.01)
*G03F 9/00* (2006.01)
*H01J 37/22* (2006.01)

(52) U.S. Cl.
CPC .......... *G02B 21/0016* (2013.01); *G03F 9/7003* (2013.01); *G03F 9/7092* (2013.01); *H01J 37/222* (2013.01)

(58) Field of Classification Search
None
See application file for complete search history.

(56) References Cited

U.S. PATENT DOCUMENTS

| 6,259,960 B1 | 7/2001 | Inokuchi |
| 8,588,509 B1* | 11/2013 | Fua et al. ................ 382/144 |
| 2006/0284081 A1 | 12/2006 | Miyamoto et al. |
| 2007/0210252 A1 | 9/2007 | Miyamoto |
| 2008/0297783 A1* | 12/2008 | Urano et al. ............. 356/237.5 |
| 2009/0039263 A1* | 2/2009 | Matsuoka et al. ......... 250/311 |

(Continued)

FOREIGN PATENT DOCUMENTS

| JP | 7-270144 | 10/1995 |
| JP | 10-135288 | 5/1998 |
| JP | 2000-352697 | 12/2000 |
| JP | 2002-62112 | 2/2002 |
| JP | 2007-3212 | 1/2007 |
| JP | 2007-103645 | 4/2007 |

(Continued)

OTHER PUBLICATIONS

JP Office Action for Japanese Application No. 2010-261157, issued on Jan. 7, 2014.

*Primary Examiner* — Andrae S Allison
(74) *Attorney, Agent, or Firm* — Baker Botts L.L.P.

(57) ABSTRACT

In order to provide a technique for performing global alignment (detecting position shift and rotation of a wafer) stably and automatically using an optical microscope, as a pattern for global alignment, multiple alignment pattern candidates are calculated (107), multiple data for matching are created for each alignment pattern (108), matching is performed with respect to the data for matching for each alignment pattern in descending order of appropriateness as an alignment pattern with an image (113) based on an image signal from the optical microscope (114), and the amount of position shift and the amount of rotation of the wafer are calculated (116) on the basis of the results of matching (115).

7 Claims, 15 Drawing Sheets

(56) References Cited

U.S. PATENT DOCUMENTS

2011/0261190 A1  10/2011  Nakagaki et al.
2012/0138796 A1*  6/2012  Sasajima et al. .............. 250/311
2013/0010100 A1*  1/2013  Kotaki et al. .................. 348/80

FOREIGN PATENT DOCUMENTS

| | | |
|---|---|---|
| JP | 2007-250528 | 9/2007 |
| JP | 2010-87322 | 4/2010 |
| WO | WO 2005/001593 A2 | 1/2005 |

* cited by examiner

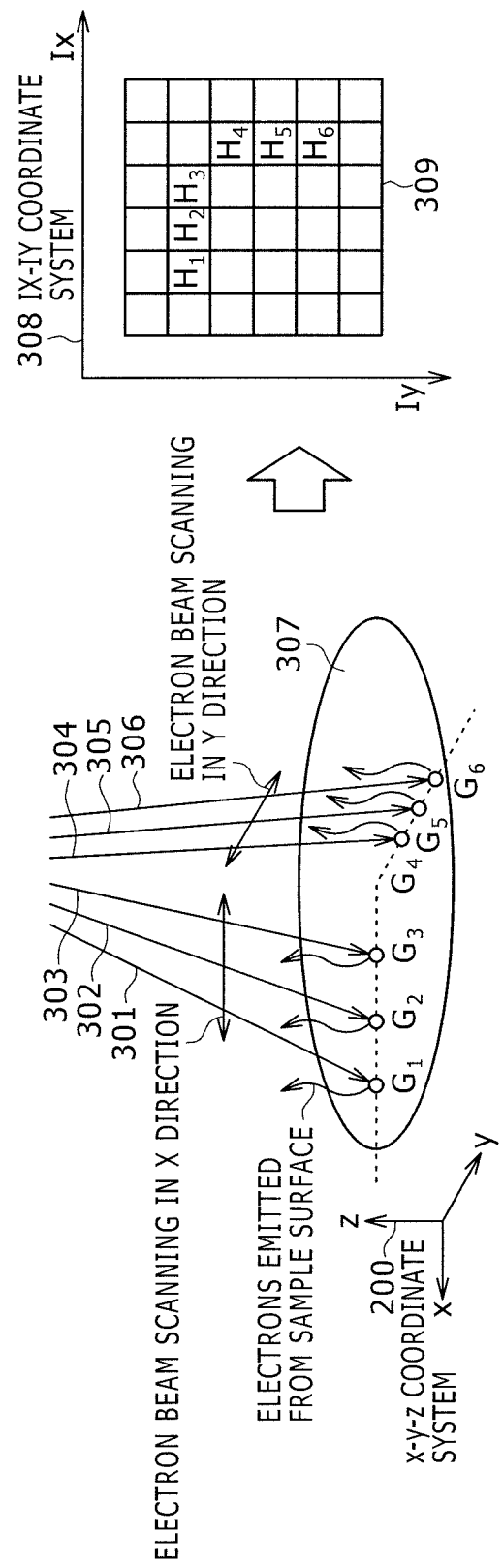

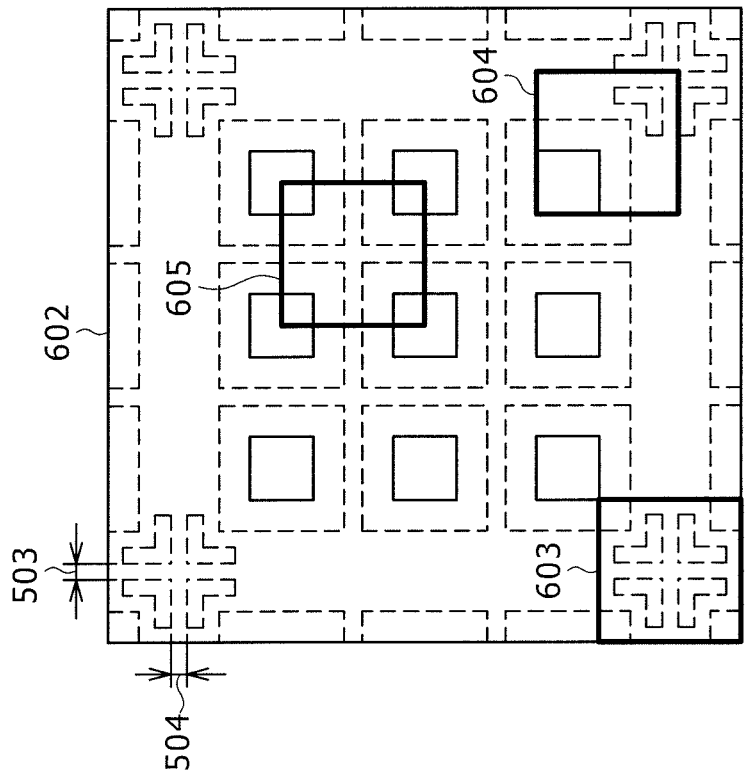
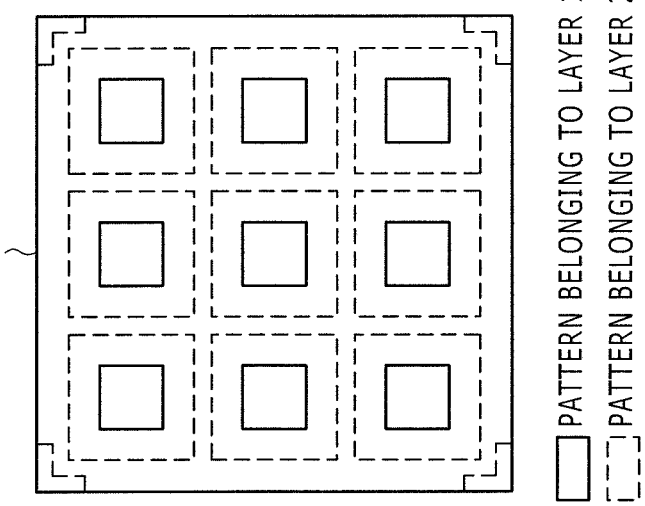
PATTERN BELONGING TO LAYER 1
PATTERN BELONGING TO LAYER 2

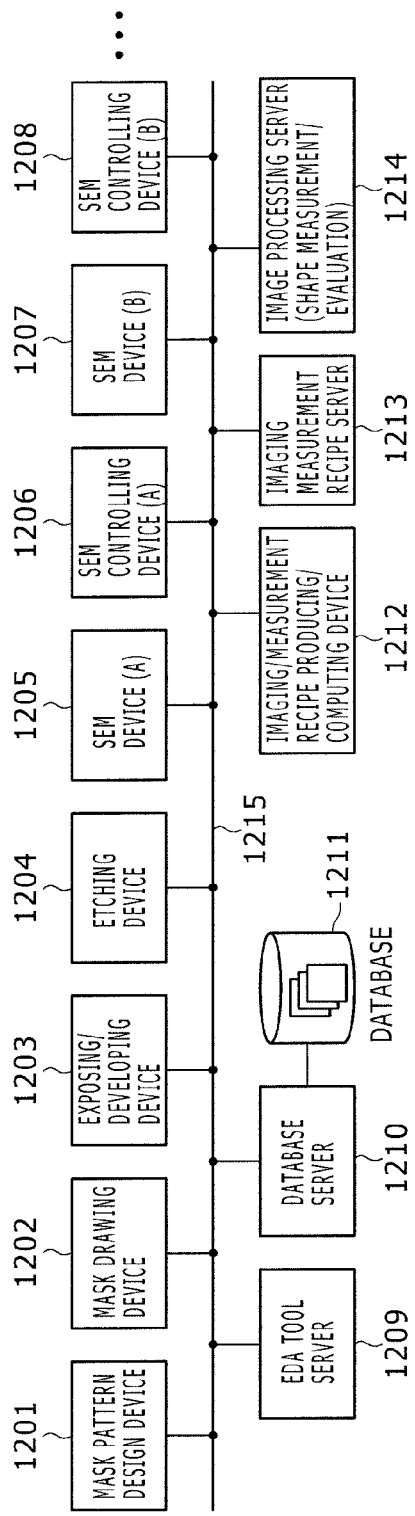
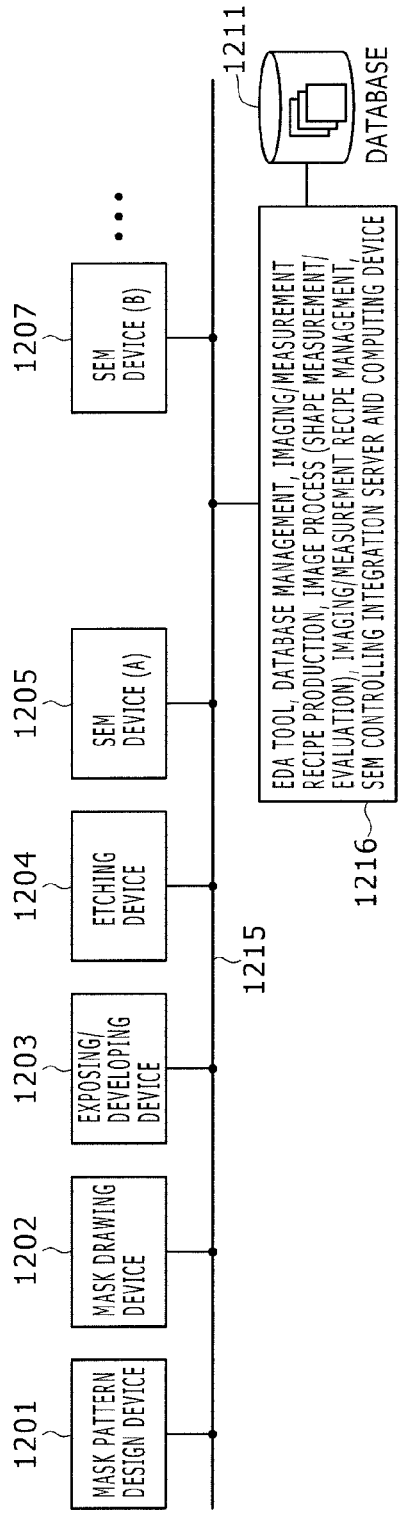

GLOBAL ALIGNMENT USING MULTIPLE ALIGNMENT PATTERN CANDIDATES

TECHNICAL FIELD

The present invention relates to an imaging device having a global alignment function and an imaging method.

BACKGROUND ART

As a method of forming a circuit pattern on a semiconductor wafer, the following method and the like have been employed. A semiconductor wafer is coated with a coating material called a resist; an exposure mask (reticle) of a circuit pattern is laminated on the resist; visible light, ultraviolet light, or an electron beam is irradiated thereon; the resist is exposed for development to form a circuit pattern by the resist on the semiconductor wafer; and the semiconductor wafer is etched using the circuit pattern of the resist as a mask.

When designing and manufacturing a semiconductor device, dust management in a manufacturing device such as an exposing/etching device and evaluation of a circuit pattern shape formed on a wafer are important, and an inspection and measurement are performed by an optical or SEM (Scanning Electron Microscope)-type imaging device. As an optical imaging device, an optical defect inspection device in which defects are detected by illuminating a laser beam onto a wafer to observe scattered light from defects in the dark field of view, or an optical appearance inspection device in which the positions of defects are specified on the basis of an optical image in the bright field of view detected by irradiating a lamp beam or laser beam is known (for example, Japanese Patent Application Laid-Open No. H7-270144 (Patent Document 1) and Japanese Patent Application Laid-Open No. 2000-352697 (Patent Document 2)). As an SEM-type imaging device, a CD-SEM (Critical Dimension Scanning Electron Microscope), or a DR-SEM (Defect Review Scanning Electron Microscope) is known (for example, Japanese Patent Application Laid-Open No. 2007-250528 (Patent Document 3) and Japanese Patent Application Laid-Open No. 2010-087322 (Patent Document 4)). Further, a scanning charged particle microscope such as an SIM (Scanning Ion Microscope) or an STEM (Scanning Transmission Electron Microscope) is used in some cases.

As circuit pattern evaluation methods in, for example, the CD-SEM among the imaging devices, there are (1) a method of measuring dimensions such as the width of a line pattern and the diameter of a contact hole so-called CD values, (2) a method of calculating the amount of characteristics of an image that is high in correlation with a pattern shape, and (3) a method of detecting the two-dimensional outline of a patter from an SEM image of a circuit pattern (hereinafter, referred to as an evaluation pattern) to be evaluated. In order to stably perform the evaluation with a high degree of accuracy, it is necessary to obtain a high-magnification and high definition SEM image using the CD-SEM. Specifically, it is required to match the field of view to an arbitrary evaluation pattern on a wafer at hundreds of thousands of magnifications, and to adjust the focus position of a converged electron beam to be irradiated to the surface of the wafer. An imaging sequence including the movement of the field of view and the image quality adjustment is designated using a file called an imaging recipe. Once the imaging recipe is produced, the same kind of wafer can be automatically imaged by the CD-SEM without special operations by an operator.

In order to image and evaluate fine circuit patterns in the imaging device represented by the CD-SEM, it is necessary to perform global alignment (detection of position shift and detection of rotation of a wafer) of a wafer. In the global alignment, patterns on a wafer whose coordinates are already known are imaged at a few positions as alignment patterns, and the imaged images and a preliminarily-prepared image (hereinafter, referred to as a "template" or "matching data" of an alignment pattern) of an alignment pattern are matched to each other, so that the position shift and the rotation of the wafer are detected. An optical microscope is used to image the alignment pattern.

PRIOR ART DOCUMENT

Patent Document

Patent Document 1: Japanese Patent Application Laid-Open No. H7-270144
Patent Document 2: Japanese Patent Application Laid-Open No. 2000-352697
Patent Document 3: Japanese Patent Application Laid-Open No. 2007-250528
Patent Document 4: Japanese Patent Application Laid-Open No. 2010-087322

SUMMARY OF THE INVENTION

Problem to be Solved by the Invention

As described above, an optical microscope is used to image the alignment pattern. However, the vision of an optical microscope image (hereinafter, referred to as an OM image) differs depending on the imaging conditions of the optical microscope or changes in the thickness of a wafer laminated film. Therefore, a difference between a template of a preliminarily-prepared alignment pattern and an OM image obtained by actually imaging an alignment pattern becomes large in some cases, leading to a low success rate of matching between the template and the OM image. In order to improve the accuracy of the imaging position and the automation rate of the imaging device, it is necessary to stably and automatically perform the global alignment.

Means for Solving the Problem

In order to solve the above-described problem, the present invention provides an imaging device having a global alignment function and an imaging method with the following characteristics.

(1) An imaging method for imaging an image of a circuit pattern formed on a wafer using an imaging device provided with an optical microscope for global alignment, the method comprising:

a design data inputting step of inputting design data of the circuit pattern;

an alignment pattern candidate determination step of evaluating proper degrees as alignment patterns of the wafer on the basis of the design data and determining multiple alignment pattern candidates on the basis of the proper degrees;

a matching data producing step of storing the design data corresponding to the alignment patterns determined in the alignment pattern candidate determination step or image data produced from the design data in a recipe as matching data;

a wafer mounting step of mounting the wafer to the imaging device;

an imaged image obtaining step of imaging patterns on the wafer corresponding to the alignment pattern candidates determined in the alignment pattern candidate determination step using the optical microscope for global alignment;

a matching step of matching the matching data produced in the matching data producing step and the imaged image obtained in the imaged image obtaining step to each other; and a step of calculating the amount of position shift and/or the amount of rotation of the wafer on the basis of the result in the matching step.

An explanation of the method will be further made below. In order to perform excellent global alignment, it is necessary to select an alignment pattern suitable for matching between the matching data (template) and the imaged image (OM image) imaged by the optical microscope from the wafer. Accordingly, it is advantageous that proper degrees as the alignment patterns are evaluated on the basis of the design data of the circuit pattern formed on the wafer to determine the alignment pattern candidates on the basis of the proper degrees. Further, the OM image is changed depending on the imaging conditions of the optical microscope and changes of the thickness of a wafer laminated film, and there is a risk of failure of the matching. Thus, multiple alignment pattern candidates are determined. Accordingly, if the matching fails in any one of the alignment pattern candidates but succeeds in any other alignment pattern candidate, the global alignment can succeed.

Further, variations of the multiple alignment pattern candidates include not only a difference between the imaging positions (imaging fields of view, hereinafter, referred to as FOVs) of the alignment patterns on the wafer, but also a difference between regions (hereinafter, referred to as template positions) used for matching in the FOV. Specifically, there possibly exist areas some of which are suitable for matching and the other of which are not in the FOV. Thus, areas used for matching can be selectively designated in the FOV. Further, variations of the multiple alignment pattern candidates include a difference between optical conditions at the time of imaging the alignment patterns. The optical conditions are detection conditions of light and imaging conditions (the amount of illumination, an imaging magnification, and the like). As an example of the detection conditions of light, there is a difference between wavelength/polarization filters. This means that when an image is produced by detecting scattered light from a wafer in an optical microscope, light is detected while blocking or reducing scattered light of specific wavelength components or polarization components by filtering. If an optical microscope in which the specific wavelength components or polarization components can be changed is used, the difference can be used as a variation of the alignment pattern candidate.

Data to be registered in the recipe as the matching data is desirably suitable for matching with the OM image. Accordingly, the design data at the position corresponding to the alignment pattern may be registered as it is. Alternatively, in order to easily perform matching with the pattern in the OM image, the design data in which the shape is changed to be similar to the actual pattern shape may be registered (for example, the corners of the pattern are rounded in consideration of the optical proximity effect at the time of exposure). Further, in order to easily perform matching in accordance with the data format and gray value of the OM image, data obtained by converting the design data into image data may be registered.

(2) The imaging method, wherein a laminated layer group of the circuit patterns that can be expected to be observed by the optical microscope is designated, and the proper degrees of the alignment pattern candidates of the section (1) are calculated on the basis of whether a pattern suitable for matching performed in the matching step of the section (1) is included in the designated arbitrary laminated layer.

Plural pieces of layer information are included in the design data of the circuit patterns in some cases. However, patterns with the plural pieces of layer information are not necessarily formed on the wafer mounted to the imaging device. Further, it is impossible to observe with the optical microscope in some cases depending on the material of a layer film (for example, an oxide film such as $SiO_2$ is nearly transparent). Accordingly, a laminated layer group of circuit patterns that can be expected to be observed by the optical microscope is designated on the basis of material and film thickness information of each layer or process information such as wafer manufacturing process information. Accordingly, the proper degrees are calculated on the basis of whether a pattern suitable for matching is included in a layer that can be expected to be observed. However, for example, the film thickness is not always uniform in a wafer plane, and the process information is not necessarily provided with accuracy. Further, it is difficult to accurately estimate how the pattern is observed by the optical microscope in some cases. Therefore, the proper degrees are calculated on the basis of whether a pattern suitable for matching is included in each of the all designated laminated layers. Accordingly, even if any one of layers disappears in the OM image, the matching can succeed using a pattern of another layer.

(3) The imaging method, wherein in the matching data producing step of the section (1), imaged images that can be obtained when imaging the alignment pattern candidates with the optical microscope are emulated in plural ways by a computer on the basis of the design data at the position of the alignment pattern candidate, so that plural pieces of matching data are produced.

Data to be registered in the recipe as the matching data is desirably suitable for matching with the OM image. Accordingly, the OM image of the alignment pattern candidates is emulated from the design data, so that matching data similar to an actually-imaged OM image is produced. As an embodiment of the emulation, for example, the shape of the design data is changed to be similar to the actual pattern shape as described in the section (1), an actual pattern estimated shape is produced, and then how the actual pattern estimated shape is observed in the OM image is estimated by a computer. However, it is difficult to accurately estimate the actual pattern shape or the grey information in the OM image in some cases. Accordingly, shape changes estimated and a difference in vision are emulated in plural ways, so that plural pieces of matching data are produced for the respective alignment pattern candidates. Accordingly, if the matching fails in any one of the plural pieces of matching data but succeeds in any other piece of matching data, the global alignment can succeed.

(4) The imaging method, wherein in the matching step of the section (1), success or failure of the matching is determined, and the matching with the imaged image is repeated until the matching succeeds while changing the plural pieces of matching data described in claim 3, or the matching is performed using the matching data that is most similar to the imaged image of the section (1) among the plural pieces of matching data.

(5) The imaging method, wherein success or failure of the matching is determined in the matching step of the section (1), the imaged image obtaining step and the matching step of the section (1) are repeated until the matching succeeds in the matching step, and imaging is sequentially performed in the imaged image obtaining step starting from the alignment pattern candidate with the highest proper degree obtained in the alignment pattern candidate determination step of the section (1).

(6) The imaging method, wherein on the basis of the imaged image of the section (1) or success or failure of the matching in the matching step described in claim 1, the value of the proper degree for each alignment pattern candidate is updated.

The alignment pattern candidates are determined on the basis of the proper degrees of the alignment patterns calculated on the basis of the design data. However, since the proper degrees are estimated values, the values are possibly different from actual values. For example, a layer or pattern that is assumed as visible is actually of low contrast, or patterns that are not present on the design data appear in the actual OM image due to interference by scattered light. When the OM image of the alignment pattern is obtained, the vision of the actual pattern in the OM image can be recognized. The proper degrees can be updated on the basis of the vision. Further, even in the case of alignment patterns having the same pattern on the design data, the OM image that is slightly different can be actually obtained in some cases depending on a position in a wafer plane. In such a case, plural OM images are obtained even in the case of alignment patterns on the same design data, so that variations of vision of the OM image can be known. On the basis of the variations, the proper degrees can be updated. For example, a higher proper degree is set for the alignment pattern candidate in which a region that is changed in vision is located out of the template position. Likewise, the proper degrees of the alignment pattern candidates can be updated on the basis of success or failure of the actual result of the matching between the alignment pattern candidates and the OM image. As described above, the OM image imaged in the past or the past matching result are reflected on the proper degrees, so that more accurate proper degrees can be set. In addition, when imaging the alignment pattern candidates in the order of the proper degrees until the matching succeeds as described in the section (5), the matching can succeed the less number of times of imaging.

(7) An imaging device provided with an optical microscope for global alignment to image an image of a circuit pattern formed on a wafer, the device comprising:

design data inputting means that inputs design data of the circuit pattern;

imaging recipe producing means that evaluates proper degrees as alignment patterns of the wafer on the basis of the design data and determining multiple alignment pattern candidates on the basis of the proper degrees, and stores the design data corresponding to the determined alignment pattern candidates or image data produced from the design data in a recipe as matching data;

wafer mounting means that mounts the wafer to the imaging device;

imaged image obtaining means that images patterns on the wafer corresponding to the alignment pattern candidates determined by the imaging recipe producing means using the optical microscope for global alignment; and matching means that matches the matching data produced by the imaging recipe producing means and the imaged image obtained by the imaged image obtaining means to each other, wherein the amount of position shift and/or the amount of rotation of the wafer are calculated on the basis of the result obtained by the matching means.

(8) An imaging device that images an image of a circuit pattern formed on a wafer, the device comprising:

an optical microscope for global alignment;

a storing unit that stores an image signal from the optical microscope; and a display unit that displays an image on the basis of the image signal, wherein the display unit further displays an imaging position candidate list table of multiple alignment pattern candidates for global alignment.

Effect of the Invention

According to the present invention, it is possible to stably and automatically perform global alignment in an imaging device. Accordingly, the accuracy of an imaging position and the automation rate of the imaging device can be improved.

BRIEF DESCRIPTION OF THE DRAWINGS

FIG. 3 is a diagram for explaining a method of imaging the amount of signals of electrons emitted from a semiconductor wafer.

FIGS. 6A and 6B are diagrams for showing variations of alignment pattern candidate imaging positions, wherein 6A shows design data (circuit patterns) of one chip, and 6B shows processed design data (circuit patterns).

FIGS. 12A and 12B are outline configuration diagrams of device systems including the imaging device shown in FIG. 1, wherein FIG. 12A shows an example in which plural control units are provided, and 12B shows an example in which control units are integrated into one.

BEST MODE FOR CARRYING OUT THE INVENTION

The present invention relates to an imaging device that images and evaluates an image of a circuit pattern formed on a wafer and stably and automatically performs global alignment (detection of position shift and rotation of a wafer) of the wafer in a design or manufacturing process of a semiconductor device, and an imaging method. Hereinafter, an embodiment according to the present invention will be described using an example of an SEM (Scanning Electron Microscope) that is one of the imaging devices. However, the present invention is not limited to this, but can be generally applied to a device in which alignment of a wafer mounted is required such as an optical defect inspection device or an optical appearance inspection device that is an optical imaging device, an SIM (Scanning Ion Microscope) that is a scanning charged particle microscope other than the SEM, an STEM (Scanning Transmission Electron Microscope), or an SPM (Scanning Probe Microscope). Further, the present invention can be applied to not only a semiconductor device, but also alignment of a sample to be imaged and evaluated.

Hereinafter, the present invention will be described in detail using an embodiment with reference to the drawings.

Embodiment

1. Imaging Device
1.1 Constitutional Elements of SEM

Figure 2:
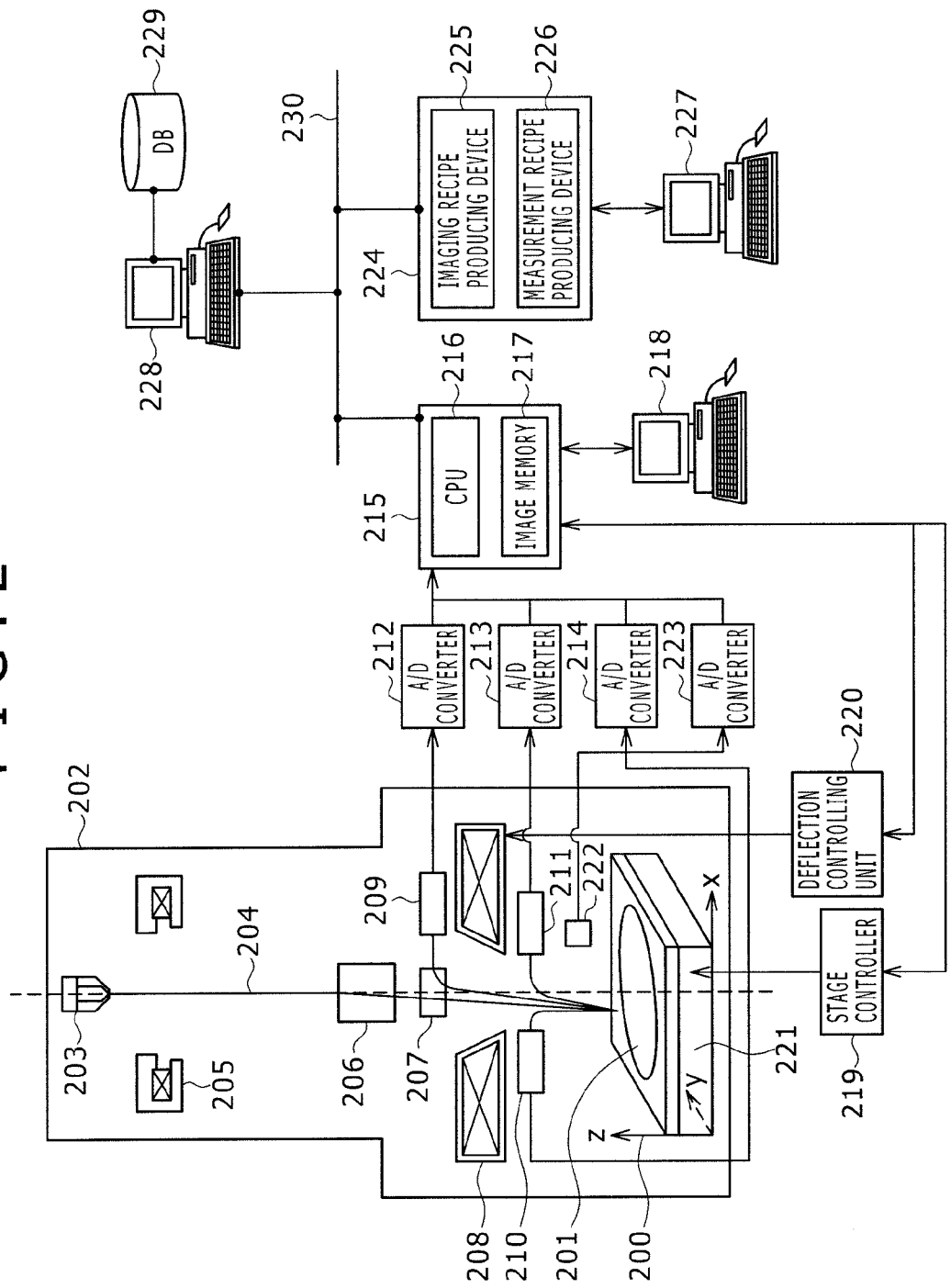
FIG. 2 is an outline entire configuration diagram of an imaging device (SEM device) according to the embodiment.

As an example of an imaging device provided with an optical microscope for global alignment, a block diagram of constitutional elements of an SEM that obtains an SE (Secondary Electron) image or a BSE (Backscattered Electron) image of a sample is shown in FIG. 2. Further, the SE image and the BSE image are collectively referred to as an SEM image. In addition, images obtained in this case include a part or all of top-down images obtained by irradiating an electron beam onto a measurement target from the vertical direction or tilt images obtained by irradiating an electron beam from an arbitrarily-inclined direction.

An electron optical system 202 includes therein an electron gun 203 that generates an electron beam 204. The electron beam emitted from the electron gun 203 is narrowed down to a thin beam by a condenser lens 205, and then the irradiation position and aperture of the electron beam are controlled by a deflector 206 and an objective lens 208, so that the electron beam is irradiated while being connected to the focal point on a semiconductor wafer 201 that is a sample placed on a stage 221. Secondary electrons and backscattered electrons are emitted from the semiconductor wafer 201 onto which the electron beam is irradiated, and the secondary electrons separated from the orbit of the irradiated electron beam by an ExE deflector 207 are detected by a secondary electron detector 209. On the other hand, the backscattered electrons are detected by backscattered electron detectors 210 and 211. The backscattered electron detectors 210 and 211 are installed in directions that are different from each other. The secondary electrons and backscattered electrons detected by the secondary electron detector 209 and the backscattered electron detectors 210 and 211 are converted into digital signals by A/D converters 212, 213, and 214. The digital signals are input to a processing/controlling unit 215 to be stored in an image memory 217, and an image process is performed by a CPU 216 for various purposes. FIG. 2 shows an embodiment in which two detectors of the backscattered electron images are provided. However, the detectors of the backscattered electron images can be eliminated, or the number of detectors can be decreased or increased. It should be noted that the reference numeral 200 denotes an x-y-z coordinate system (a coordinate system of an electron optical system); 218 and 227, processing terminals; 222, an optical microscope; 224, a recipe producing unit; 228, a database server; 229, a database (storage); and 230, a network.

FIG. 3 shows a method of imaging the amount of signals of electrons emitted from the semiconductor wafer when electron beams are scanned and irradiated onto the semiconductor wafer 307. The electron beams are scanned and irradiated as indicated by 301 to 303 or 304 to 306 in the x and y directions, as shown on, for example, the left side of FIG. 3. The deflection directions of the electron beams are changed, so that the scanning directions thereof can be changed. The positions on the semiconductor wafer on which the electron beams 301 to 303 scanned in the x direction are irradiated are represented by G1 to G3, respectively. Likewise, the positions on the semiconductor wafer on which the electron beams 304 to 306 scanned in the y direction are irradiated are represented by G4 to G6, respectively. The amounts of signals of electrons emitted from G1 to G6 are represented as brightness values of pixels H1 to H6 in an image frame 309 shown on the right side of FIG. 3 (indexes 1 to 6 of G and H correspond to each another). The reference numeral 308 denotes a coordinate system that indicates the x and y directions on an image (referred to as an Ix-Iy coordinate system). The electron beams are scanned in the field of view as described above, so that the image frame 309 can be obtained. The electron beams are practically scanned plural times in the field of view in the same manner, and the obtained image frames are averaged, so that an image with a high S/N can be obtained. The number of addition frames can be arbitrarily set.

The processing/controlling unit 215 in FIG. 2 is a computer system provided with the CPU 216 and the image memory 217, and performs a process and control such as transmitting a control signal to a stage controller 219 or a deflection controlling unit 220 in order to image an area including a circuit pattern that is an evaluation target as an evaluation pattern on the basis of an imaging recipe, or performing various image processes for an imaged image with an arbitrary evaluation pattern on the semiconductor wafer 201 on the basis of a measurement recipe.

The imaging recipe will be described later in detail. The measurement recipe is a file that designates an image processing algorithm or a processing parameter to perform evaluation such as defect detection or pattern shape measurement in an imaged SEM image, and the SEM obtains an evaluation result by processing the SEM image on the basis of the measurement recipe.

Further, the processing/controlling unit 215 is connected to the processing terminal 218 (including input and output units such as a display, a keyboard, and a mouse), and includes a GUI (Graphic User Interface) that displays an image or the like for a user or accepts an input from a user. The reference numeral 221 denotes the XY stage that moves the semiconductor wafer 201 to enable imaging of the semiconductor wafer at an arbitrary position. Changing the imaging position with the XY stage 221 is referred to as stage shift, and changing the observing position while deflecting the electron beam with, for example, the deflector 206 is referred to as image shift. In general, the stage shift has the property that the movable range is wide, but the positioning accuracy of the imaging position is poor. On the contrary, the image shift has the property that the movable range is narrow, but the positioning accuracy of the imaging position is excellent.

The optical microscope 222 in FIG. 2 is used for global alignment. Because the position of the wafer mounted on the stage is largely shifted or the wafer is largely rotated, an alignment pattern to be imaged is located out of the field of view in an electron microscope with a high magnification. Thus, the alignment pattern is imaged using an optical microscope with a low magnification (a wide imaging field of view) to perform global alignment. An image imaged by an optical microscope is referred to as an OM image. An image signal obtained by the optical microscope 222 is converted into a digital signal by an A/D converter 223, and the digital signal is input to the processing/controlling unit 215 to be stored in the image memory 217 as an OM image. The CPU 216 performs matching between the OM image and a template of the alignment pattern to calculate the amount of position shift and the amount of rotation of the wafer using the amount of matching shift.

The recipe producing unit 224 in FIG. 2 is a computer system provided with an imaging recipe producing device 225 and a measurement recipe producing device 226. The recipe producing unit 224 is connected to the processing terminal 227, and includes a GUI that displays a produced recipe for a user or accepts a recipe amendment from a user.

The processing/controlling unit 215 can transmit and receive information to/from the recipe producing unit 224 via the network 230. The database server 228 having the storage 229 is connected to the network, and can store and share a part or all of such following information while being linked to the type, manufacturing process, date and time, and data obtaining device as (a) design data (mask design data (presence/absence of OPC (Optical Proximity Correction) and wafer transcription pattern design data); (b) produced imaging/measurement recipe; (c) imaged image (OM image or SEM image); (d) imaging/evaluation result (matching result (matching position, success or failure, the degree of reliability) between an OM image and a template of the alignment pattern, the value of a pattern length, the amount of image characteristics, the pattern outline, and the like); and (e) determination rule of an imaging/measurement recipe. The processes performed by the processing/controlling unit 215, the recipe producing unit 224, and the database server 228 can be separately or integrally performed by plural devices in an arbitrary combination.

1.2 Imaging Recipe

Figure 4A:
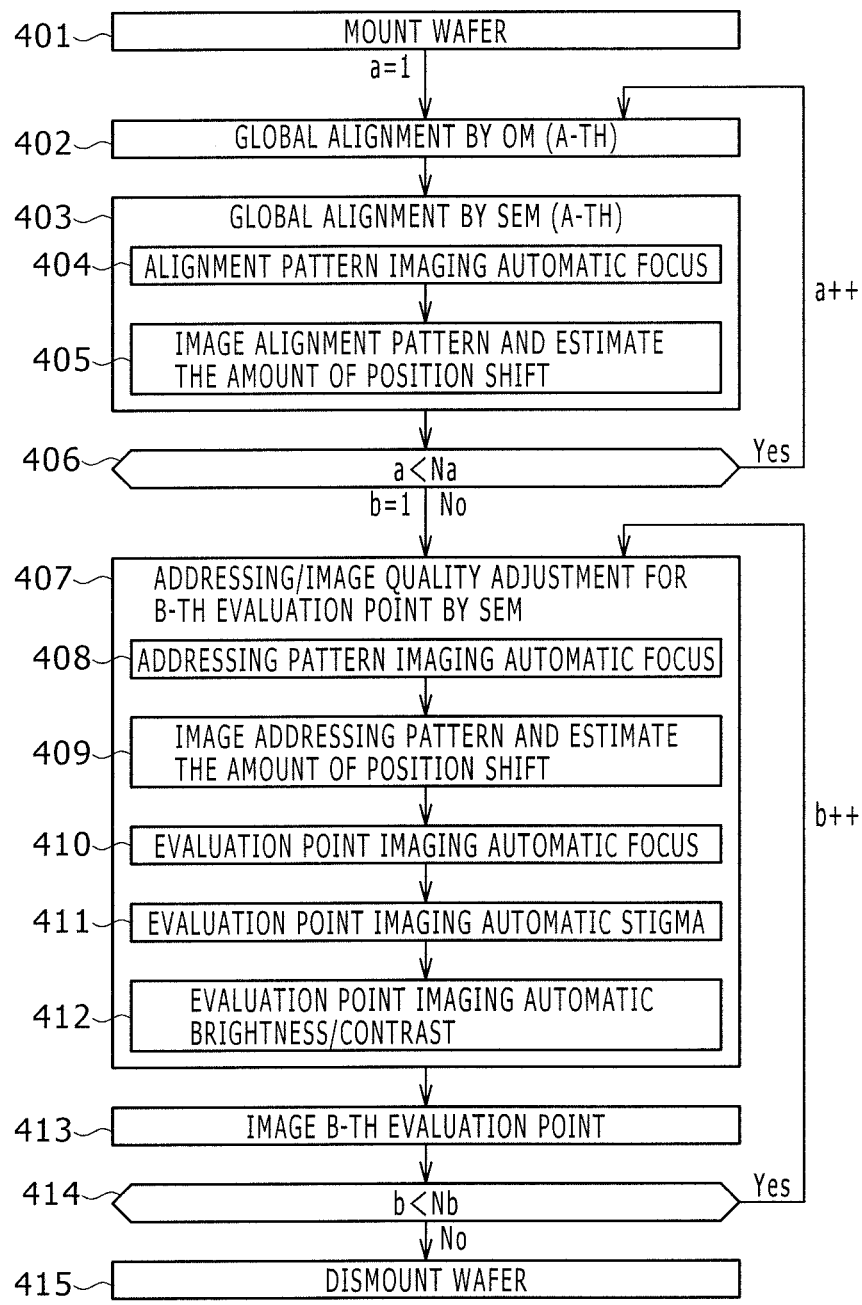
FIG. 4A is a diagram for showing an imaging sequence in the imaging device (SEM device) according to the embodiment.
Figure 4B:
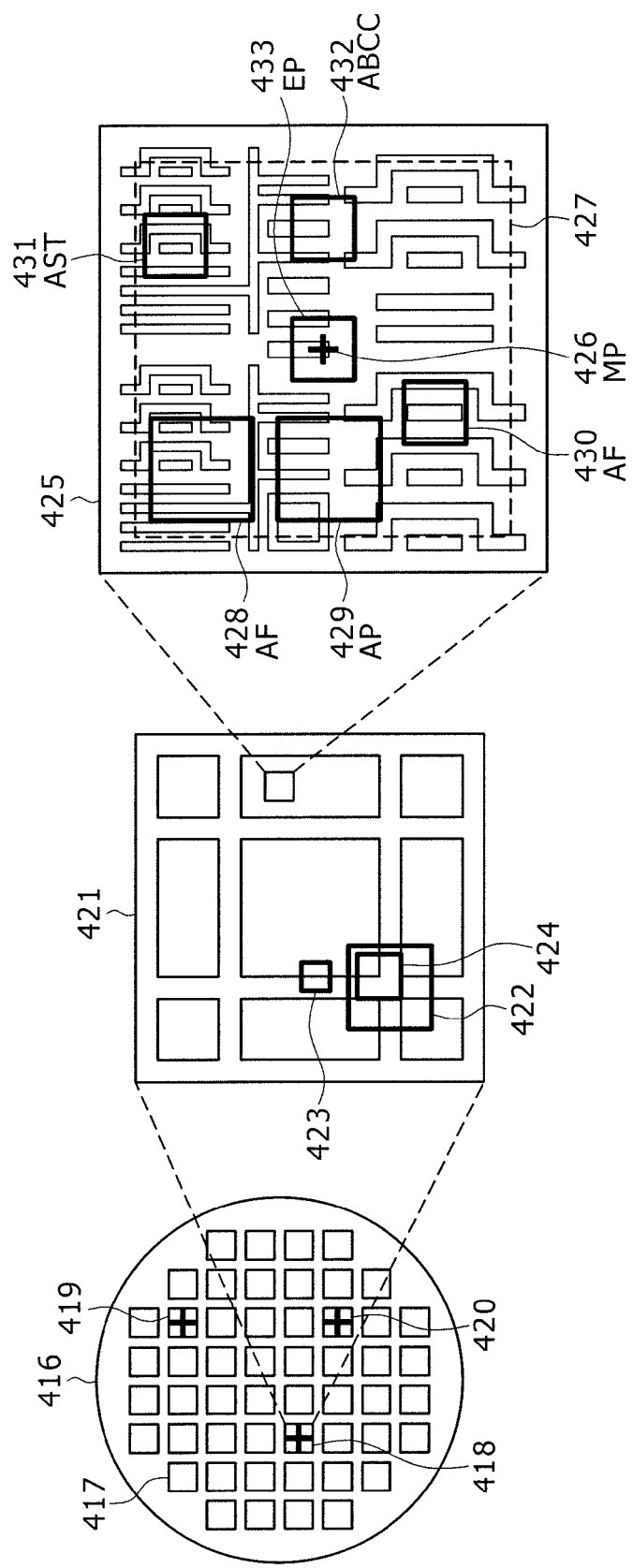
FIG. 4B is a diagram for showing an example of imaging positions corresponding to the imaging sequence shown in FIG. 4B.

The imaging recipe is a file that designates an imaging sequence and imaging conditions to image an imaging area that is an evaluation target without position shift and with a high degree of definition. An imaging area that is an evaluation target on the wafer is referred to as an evaluation pattern (EP). It should be noted that the evaluation pattern is a pattern that a user wishes to evaluate, and is not limited to an evaluation-dedicated pattern. Plural EPs are present on one wafer in some cases, and the wafer is filled with the EP in the case of an entire inspection of the wafer. FIG. 4A shows a flow diagram of a typical imaging sequence for imaging an EP, and FIG. 4B shows imaging areas corresponding to the typical imaging sequence. Hereinafter, the imaging sequence for imaging an EP 433 will be described while associating FIG. 4A with FIG. 4B.

First, in Step 401 of FIG. 4A, the semiconductor wafer (201 in FIG. 2 or 416 in FIG. 4B) that is a sample is mounted on the stage 221 of the SEM device. Square frames represented by 417 to 420 illustrated in the wafer 416 in FIG. 4B denote chips, and the reference numeral 421 denotes an enlarged view of the chip 418. In addition, the reference numeral 425 denotes a diagram obtained by enlarging a part of the chip 421 while the EP 433 is located in the middle.

Next, in Step 402, the field of view of the optical microscope 222 attached to the SEM is moved to an alignment pattern on a preliminarily-designated wafer by the stage shift, and the alignment pattern on the wafer is observed by the optical microscope to obtain an OM image. Preliminarily-prepared matching data (template) in the alignment pattern and the OM image are matched to each other to calculate the amount of shift of the wafer. The imaging range of the alignment pattern is represented by a thick frame 422 in FIG. 4B. It should be noted that the entire pattern in the imaging range represented by the reference numeral 422 possibly becomes an alignment pattern for an optical microscope and an OM alignment pattern candidate as it is.

The imaging magnification of the OM image in Step 402 is low, and thus the accuracy of the amount of shift obtained by the matching is insufficient in some cases. Accordingly, an SEM image is imaged by irradiating the electron beam 204 in Step 403, and alignment using the SEM image is performed. The FOV of an SEM is smaller than that of an optical microscope, and there is a risk that a pattern to be imaged is located out of the FOV depending on the amount of shift of the wafer. However, the approximate amount of shift can be recognized in Step 402, and thus the irradiation position of the electron beam 204 is moved in consideration of the amount of shift. Specifically, the imaging position of the SEM is first moved to an alignment pattern imaging automatic focus pattern 423 in Step 404 for imaging, and a parameter for adjusting the automatic focus is obtained. Then, the automatic focus is adjusted on the basis of the obtained parameter. Next, in Step 405, the imaging position of the SEM is moved to an alignment pattern 424 for imaging, and the preliminarily-prepared matching data (template) in the alignment pattern 424 and the SEM image are matched to each other, so that the more accurate amount of shift of the wafer is calculated. The imaging positions of the alignment pattern 422 for an optical microscope, the alignment pattern imaging automatic focus pattern 423 for an SEM, and the alignment pattern 424 for an SEM shown in FIG. 4B are examples. However, it is necessary to consider whether or not a pattern suitable for alignment or automatic focus is included in the selection of the imaging position. In the case of an alignment pattern, for example, the pattern shape or brightness pattern included in the alignment pattern are characteristic. It is desirable to satisfy the conditions in which the template and the imaged image can be easily matched to each other and the matching position is uniquely determined. In the case of an automatic focus pattern, it is desirable to satisfy the condition in which a pattern by which blurring of an image caused by focus shift can be easily detected is included The alignment using the optical microscope and SEM in Steps 402 and 403 is performed at plural areas on the wafer, and the large shift of the wafer from the original point and the rotation of the wafer are calculated on the basis of the amount of position shift obtained at the plural areas (global alignment). FIG. 4A shows an example in which the alignment is performed at Na positions (Step 406), and FIG. 4B shows an example in which the alignment is performed at three positions of the chips 418 to 420 (the cross marks denote the alignment positions). When the field of view is moved to a desired coordinate thereafter, the shift from the original point and the rotation obtained in the process are canceled.

When the alignment is finished at the wafer level, more accurate positioning (addressing) or image quality adjustment is performed for each evaluation pattern (EP) in Step 407 to image the EPs. The addressing is performed to cancel an error of stage shift occurring when the field of view is moved to each EP. Specifically, the stage is first shifted to the EP 433. Namely, the stage 221 is moved, so that the vertical incident position of the electron beam 204 is located in the middle of the EP. The vertical incident position of the electron beam is referred to as Move Coordinate (hereinafter, referred to as MP), and is indicated by a cross mark 426 when imaging the EP 433. In this case, the embodiment will be described using an example in which the MP is set in the middle position of the EP. However, the MP is set around the EP in some cases. When the MP (cross mark) 426 is determined, a range 427 (dotted frame) where the field of view can be moved only by the image shift is determined without moving the stage. It is obvious that even if the stage shift to the MP is performed, the position is actually shifted by an error of the stop of the stage shift. Next, the imaging position of the SEM is moved to an addressing pattern imaging automatic focus pattern 428 (hereinafter, referred to as AF) by the image shift in Step 408 for imaging, and a parameter for adjusting automatic focus is obtained, so that the automatic focus is adjusted on the basis of the obtained parameter. Next, in Step 409, the imaging position of the SEM is moved to an addressing pattern 429 (hereinafter, referred to as AP) for imaging, and preliminarily-prepared matching data (template) in the AP 429 and the SEM image are matched to each other, so that an error of stage shift is calculated. In the image shift thereafter, the field of view is moved so as to cancel the calculated error of stage shift. Next, in Step 410, the imaging position of the SEM is moved to an EP imaging AF 430 by the image shift for imaging, and a parameter for adjusting automatic focus is obtained, so that the automatic focus is adjusted on the basis of the obtained parameter. Next, in Step 411, the imaging position of the SEM is moved to an automatic stigma pattern 431 (hereinafter, referred to as AST) by the image shift for imaging, and a parameter for adjusting automatic stigma is obtained, so that the automatic stigma is adjusted on the basis of the obtained parameter. The automatic stigma means that in order to obtain an image having no distortion at the time of SEM imaging, astigmatism correction is performed, so that the cross-section of a converged electron beam is formed in a spot shape. Next, in Step 412, the imaging position of the SEM is moved to an automatic brightness and contrast pattern 432 (hereinafter, referred to as ABCC) by the image shift for imaging, and a parameter for adjusting automatic brightness and contrast is obtained, so that the automatic brightness and contrast is adjusted on the basis of the obtained parameter. The automatic brightness and contrast means that in order to obtain a clear image at a proper level of brightness and contrast at the time of EP imaging, a parameter such as the voltage value of a photomultiplier in, for example, the secondary electron detector 209 is adjusted, so that, for example, the highest level and the lowest level of an image signal realize the full contrast or contrast near the full contrast. The field of view is moved to the AF for the AP or the AP, AF, AST, and ABCC for the EP by the image shift, and thus it is necessary to set the field of view in the image shiftable range 427.

After the addressing and image quality adjustment are performed in Step 407, the imaging position is moved to an EP by the image shift for imaging in Step 413.

If the above-described processes (Step 407 to Step 413) are repeated and the imaging of all the EPs is finished in Step 414, the wafer is dismounted from the SEM device in Step 415.

It should be noted that the alignment and image quality adjustment in Steps 404, 405, and 408 to 412 are partially omitted, or the order thereof is changed in some cases. Further, since the embodiment is described using an example of the SEM device an imaging device, the electron microscope is used in the global alignment (Step 403) for the second time and the addressing/image quality adjustment (Step 407) for each EP. However, for example, an ion microscope is used instead in the case of an SIM device.

The imaging pattern, imaging order, and imaging conditions in such an imaging sequence are designated using the imaging recipe. Further, the matching data (template) used in the alignment and addressing is also registered in the imaging recipe. Furthermore, the matching algorithm (the image processing method and image processing parameter) in the alignment and addressing can be also registered in the imaging recipe. The SEM images an EP on the basis of the imaging recipe. Accordingly, not only the processes from Step 407 to Step 415 in which the wafer is dismounted, but also the processes from Step 401 in which the wafer is mounted to Step 402 and the processes from Step 403 to Step 406 can be automated.

2. Global Alignment

Figure 1:
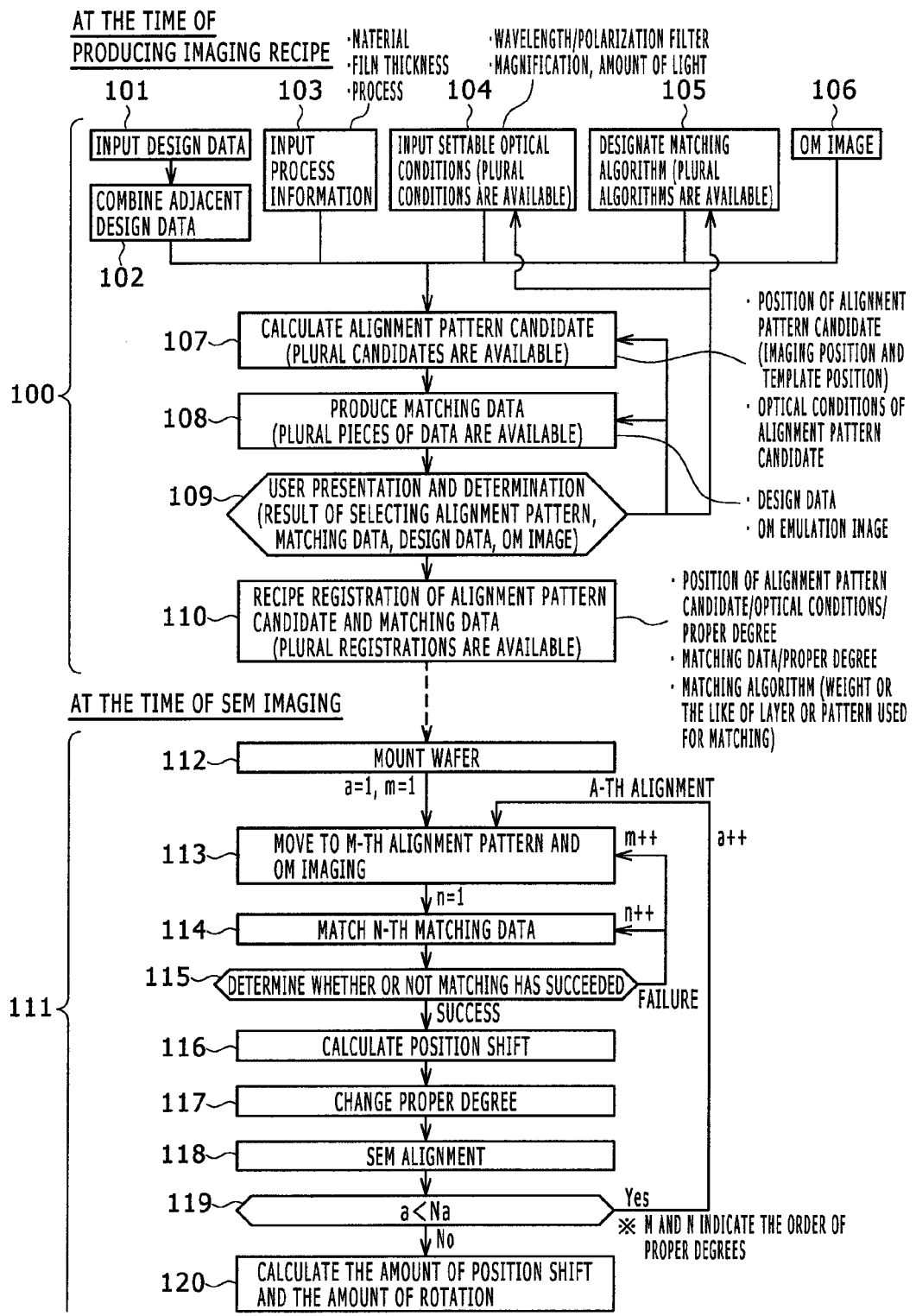
FIG. 1 shows an entire processing flow of alignment in an embodiment.

FIG. 1 shows an entire processing flow of the alignment according to the embodiment, and is roughly composed of a processing step group 100 in which the imaging recipe is produced and a processing step group 111 in which the SEM imaging is performed on the basis of the imaging recipe produced in the processing step group 100. Step 112 to Step 119 correspond to Step 401 to 406 in FIG. 4A. Hereinafter, the processing flow will be described while adding the details using FIG. 5A to FIG. 11 if necessary.

2.1. Outline

The embodiment relates to a method of imaging an image of a circuit pattern formed on a wafer using an imaging device provided with an optical microscope for global alignment. The method includes a design data inputting step 101 in which design data of the circuit pattern is input, an alignment pattern candidate determination step 107 in which proper degrees as the alignment patterns of the wafer are evaluated on the basis of the design data and multiple alignment pattern candidates are determined on the basis of the proper degrees, matching data producing steps 108 and 110 in which the design data corresponding to the alignment pattern determined in the alignment pattern candidate determination step 107 or image data produced from the design data is stored in the recipe as matching data, a wafer mounting step 112 in which the wafer is mounted to the imaging device, an imaged image obtaining step 113 in which patterns on the wafer corresponding to the alignment pattern candidates determined in the alignment pattern candidate determination step 107 are imaged using an optical microscope for global alignment, a matching step 114 in which the matching data produced in the matching data producing step and the imaged image obtained in the imaged image obtaining step are matched to each other, and a step 120 in which the position or rotation of the wafer are estimated on the basis of the result of the matching. It should be noted that dedicated patterns may be provided as the alignment pattern candidates. However, circuit patterns can be used.

In order to perform excellent global alignment, it is necessary to select an alignment pattern suitable for matching between the matching data (template) and the imaged image (OM image) imaged by the optical microscope from the wafer. Accordingly, it is advantageous that proper degrees as the alignment patterns are evaluated on the basis of the design data of the circuit pattern formed on the wafer to determine the alignment pattern candidates on the basis of the proper degrees.

2.2. Detail
2.2.1 Design Data

Figures 5A, 5B, 5C:
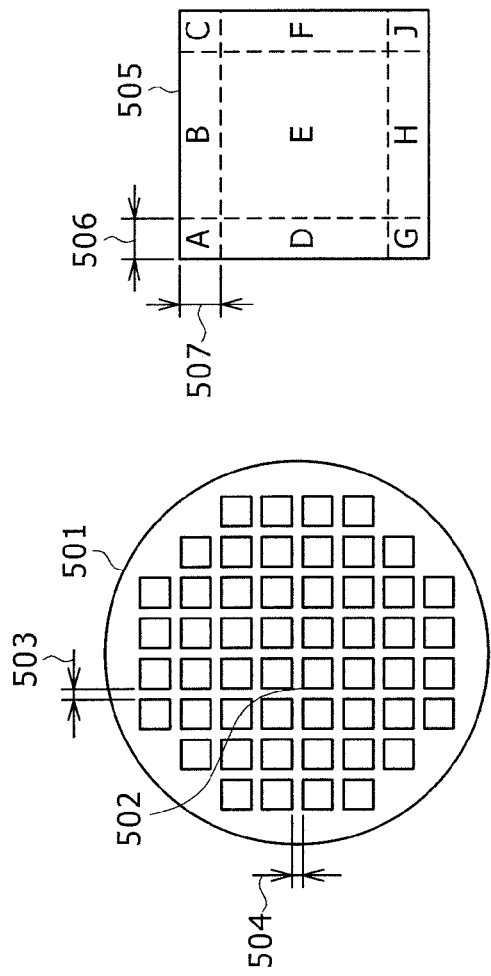
FIGS. 5A, 5B, and 5C are diagrams each showing processes of design data in consideration of adjacent chips, wherein 5A shows a wafer on which chips are arranged, 5B shows the range of design data of one chip, and 5C shows the range of processed design data.

As the design data used for the processes or display after Step 107 of FIG. 1, the design data processed in Step 102 can be used if necessary. Chips represented by the reference numeral 502 illustrated using square frames are arranged in a wafer 501 of FIG. 5A (the intervals between the chips in the x and y directions are denoted by the reference numerals 503 and 504), and a pattern of the same design data is produced in each chip. The design data input in Step 101 generally includes design data of one chip (the reference numeral 505 of FIG. 5B, only the range of the design data is illustrated and the circuit pattern is not illustrated). However, for example, the range of the alignment pattern to be determined in the alignment pattern candidate determination step 107 may extend across the chips. Thus, while assuming that adjacent chips are provided as shown in FIG. 5C, parts 508 to 515 of the design data are connected to each other around the design data 505 input in Step 101 while providing the chip intervals 503 and 504 in Step 102 (IDs A to J of the respective areas obtained by segmenting the design data correspond to each other in FIGS. 5B and 5C). The alignment pattern is searched for using the data as shown in FIG. 5C, so that, for example, an alignment pattern candidate 516 extending across the chips can be determined. The ranges 506 and 507 of the adjacent chips to be connected are determined in consideration of the size or the like of the alignment pattern.

2.2.2 Variation of Alignment Pattern Candidate

The OM image is changed depending on the imaging conditions of the optical microscope and changes of the thickness of a wafer laminated film in the alignment pattern candidate determination step 107, and there is a risk of failure of the matching. Thus, multiple alignment pattern candidates are determined. Accordingly, if the matching fails in any one of the alignment pattern candidates but succeeds in any other alignment pattern candidate, the global alignment can succeed. The reference numeral 601 of FIG. 6A denotes design data (corresponding to the reference numeral 505) of one chip illustrating circuit patterns without being omitted, and the reference numeral 602 of FIG. 6B denotes design data (corresponding to FIG. 5C) obtained by connecting parts of the design data 601 around the design data 601 while providing the chip intervals 503 and 504. The circuit patterns illustrated by the solid lines are patterns belonging to a layer 1 (for example, an upper layer), and the circuit patterns illustrated by the dashed lines is patterns belonging to a layer 2 (for example, a lower layer). As an example of determining the multiple alignment pattern candidates on the basis of the design data 602, three alignment pattern candidates 603 to 605 are determined.

Variations of the multiple alignment pattern candidates determined in the alignment pattern candidate determination step 107 include not only a difference between the imaging positions (imaging fields of view, hereinafter, referred to as FOVs) of the alignment patterns on the wafer as denoted by the reference numerals 603 to 605, but also a difference between regions (hereinafter, referred to as template positions) used for matching in the FOV. Specifically, there possibly exist areas some of which are suitable for matching and the other of which are not in the FOV. Thus, areas used for matching can be selectively designated in the FOV.

Figure 7D:
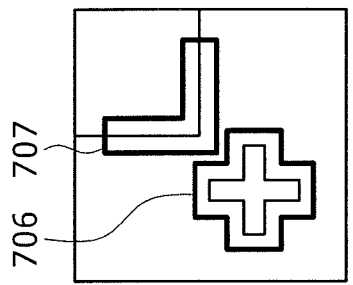
FIGS. 7A, 7B, 7C, and 7D are diagrams for showing variations of template positions, wherein 7A shows a case in which the entire imaging range including a cross pattern and a square pattern serves as a template position, 7B shows a case in which the area including the cross pattern serves as a template position, 7C shows a case in which the area including the square pattern serves as a template position, and 7D shows a case in which parts around the outlines of the cross pattern and the square pattern serve as template positions.
Figure 7C:
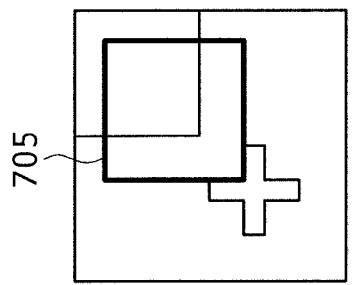
Figure 7B:
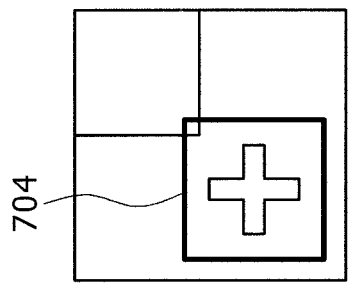
Figure 7A:
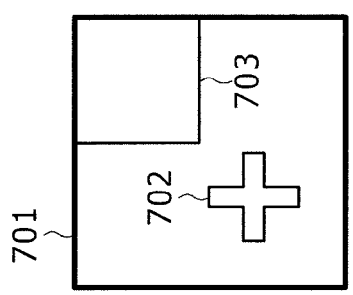

FIGS. 7A to 7D are examples of the alignment pattern candidates with the same imaging position and different template positions. A cross pattern 702 and a square pattern 703 are included in each of FIGS. 7A to 7D, and the template positions are represented by thick frames 701 and 704 to 707. FIG. 7A shows an alignment pattern candidate used in matching while using the entire imaging range as the template position 701. On the other hand, FIG. 7B shows an alignment pattern candidate used in matching while registering only an area including the cross pattern 702 as the template position 704 due to, for example, the reason that the contrast of the square pattern 703 in the OM image is possibly low. On the contrary, FIG. 7C shows an alignment pattern candidate used in matching while using an area including the square pattern 703 as the template position 705. FIG. 7D shows an alignment pattern candidate used in matching while using only the parts around the outlines of the patterns as the template positions 706 and 707 although the cross pattern 702 and the square pattern 703 are used. The alignment patterns can be provided in plural areas as described above.

FIG. 7D is advantageous in the case where, for example, patterns that are not present on the design data appear around the patterns 702 and 703 in the OM image. Such a phenomenon possibly occurs due to interference by scattered light when imaging with the optical microscope 222. If unexpected patterns are generated in the OM image, a difference between the template and the OM image becomes large, and there is a high risk of failure of the matching. If it is possible to know in advance what kind of OM image can be obtained, it is possible to determine what template position is suitable. If it is difficult to determine this, arbitrary combinations of alignment pattern candidates with different template positions represented by FIGS. 7A to 7D are stored in the imaging recipe to be used in matching. As similar to the alignment pattern candidates with different imaging positions, if the matching fails in any one of the alignment pattern candidates with different template positions but succeeds in any other alignment pattern candidate, the global alignment can succeed.

Further, variations of the multiple alignment pattern candidates include a difference between optical conditions at the time of imaging the alignment patterns. The optical conditions are detection conditions of light and imaging conditions (the amount of illumination, an imaging magnification, and the like). As an example of the detection conditions of light, there is a difference between wavelength/polarization filters. This means that when an image is produced by detecting scattered light from a wafer in an optical microscope, light is detected while blocking or reducing scattered light of specific wavelength components or polarization components by filtering. If an optical microscope in which the specific wavelength components or polarization components can be changed is used, the difference can be used as a variation of the alignment pattern candidate.

Figure 8:
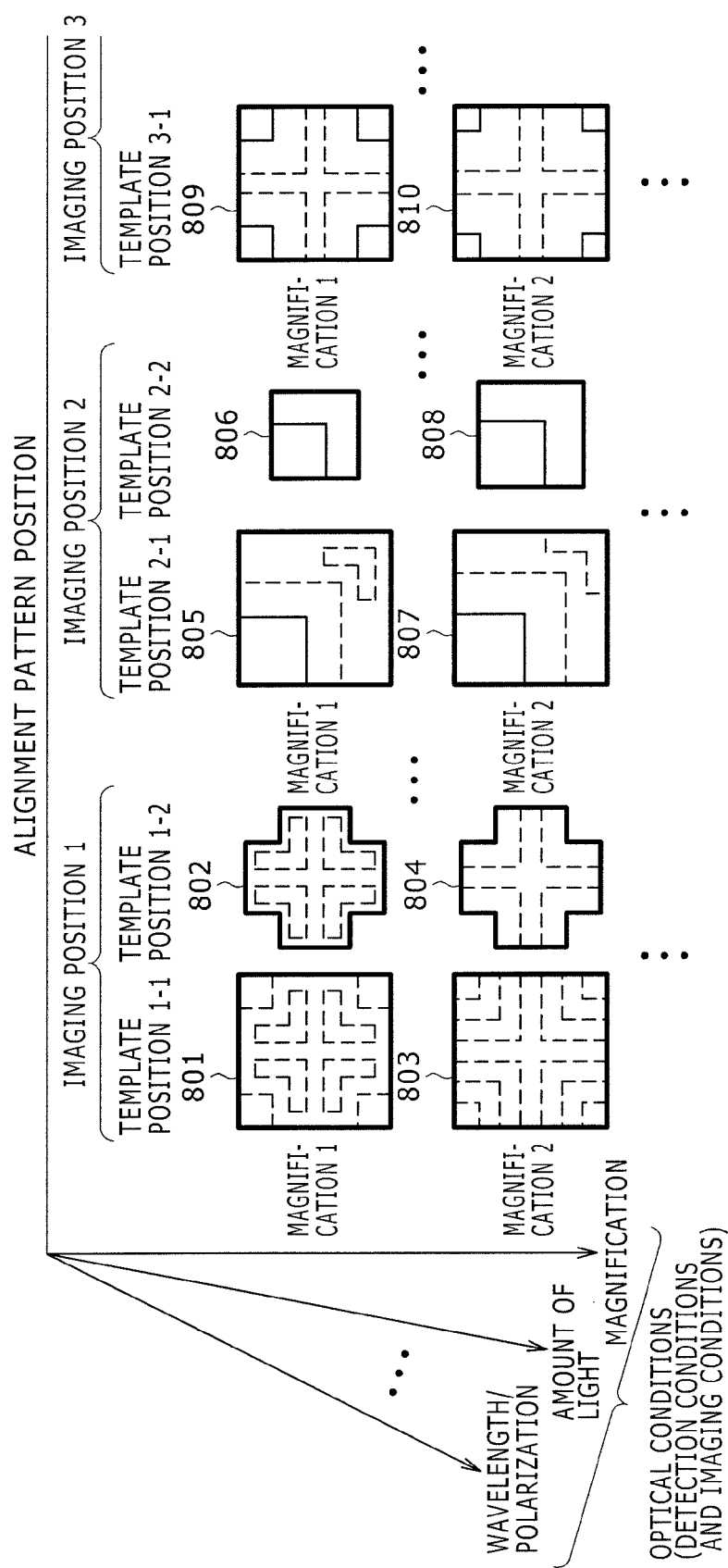
FIG. 8 is a diagram for showing variations of alignment pattern candidates.

As described above, variations of the alignment pattern candidates can include differences between the imaging positions, template positions, and optical conditions (detection conditions of light or imaging conditions), and can be schematically expressed as shown in FIG. 8. The reference numerals 801 to 810 denote parts of variations of the alignment pattern candidates. For example, the reference numeral 801 denotes an alignment pattern candidate with an imaging position 1 (corresponding to the imaging position of the alignment pattern candidate 603 in FIG. 6B), a template position 1-1 surrounded by the thick frame (the entire imaging range is used in matching), and an imaging magnification 1 in the optical microscope. The reference numeral 802 denotes an alignment pattern candidate with an imaging position 1, a template position 1-2 surrounded by the thick frame (the cross area in the imaging range is used in matching), and an imaging magnification 1 in the optical microscope. The reference numeral 807 denotes an alignment pattern candidate with an imaging position 2 (corresponding to the imaging position of the alignment pattern candidate 604 in FIG. 63), a template position 2-1 surrounded by the thick frame (the entire imaging range is used in matching), and an imaging magnification 2 (higher than the imaging magnification 1) in the optical microscope. Variations of the optical conditions include a difference between the detection conditions and imaging conditions other than the imaging magnifications (these items are illustrated in plural axes using images of multidimensional vector spaces in FIG. 8).

In the embodiment, arbitrary combinations of multiple alignment pattern candidates and the matching data are registered in the imaging recipe among the variations shown in FIG. 8, and the imaging and matching by the optical microscope on the basis of the information can be performed.

2.2.3 Variation of Matching Data

As the matching data produced and registered in the recipe in the matching data producing step 108 and the matching data recipe registering step 110, the following variations are provided.

The design data at the position corresponding to the alignment pattern may be used as matching data as it is. Alternatively, in order to easily perform matching with the pattern in the OM image, the design data in which the shape is changed to be similar to the actual pattern shape may be used as matching data (for example, the corners of the pattern are rounded in consideration of the optical proximity effect at the time of exposure).

Figure 9:
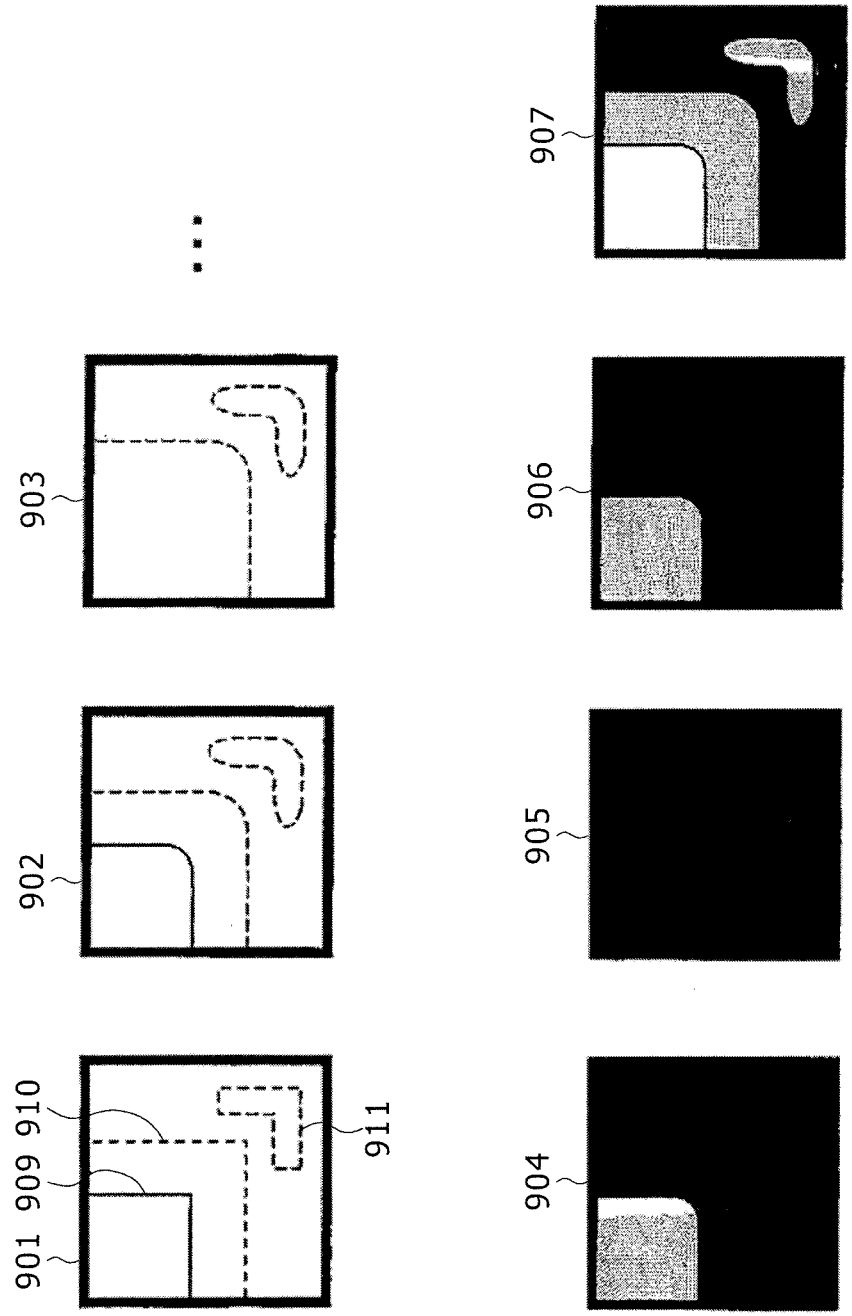
FIG. 9 is a diagram for showing variations of matching data.

The reference numerals 901 to 903 of FIG. 9 denote, as an example, variations of the design data produced as the matching data of the alignment pattern 604. Each of the matching data 901 to 903 includes a square pattern 909 belonging to a layer 1 illustrated by the solid line, and an L-shape pattern 911 belonging to a layer 2 illustrated by the dashed line. The matching data 901 is data obtained by trimming the design data at the area corresponding to the alignment pattern candidate as it is. The matching data 902 is design data obtained by rounding the corners of the pattern of the matching data 901 in consideration of the optical proximity effect at the time of exposure. The matching data 903 is design data obtained by excluding the pattern of the layer 1 from the matching data 902 on the assumption that it is difficult to observe the pattern of the layer 1 in the OM image or the contrast is changed to become unstable in some cases.

Further, in order to easily perform matching in accordance with the data format and gray value of the OM image, data obtained by converting the design data into image data may be used as the matching data. In this case, on the basis of the design data at the position of the alignment pattern candidate, estimated imaged images that can be obtained by imaging the alignment pattern candidate with the optical microscope are emulated in plural ways by a computer, so that plural pieces of matching data can be produced. As an embodiment of the emulation, for example, the shape of the design data is changed to be similar to the actual pattern shape as the matching data 902, an actual pattern estimated shape is produced, and then how the actual pattern estimated shape is observed in the OM image is estimated by a computer. For the emulation of the OM image, material and film thickness information of each layer or process information such as wafer manufacturing process information may be used.

The process information can be input in Step 103. The design data (the gray value in the OM image is affected by not only the material of the pattern, but also the shape and density of the pattern) and the process information (for example, the reflectance of light can be recognized using material information) are used, so that the gray value of the pattern in the OM image can be accurately estimated. However, it is difficult to accurately estimate the actual pattern shape or the grey information in the OM image in some cases. Accordingly, shape changes estimated and a difference in vision are emulated in plural ways, so that plural pieces of matching data are produced for the respective alignment pattern candidates. Accordingly, if the matching fails in any one of the plural pieces of matching data but succeeds in any other piece of matching data, the global alignment can succeed.

The reference numerals 904 to 907 of FIG. 9 denote, as an example, variations of the emulation image produced as the matching data of the alignment pattern 604. The matching data 904 is a gray image obtained by emulating the OM image using the design data or process information. In the drawing, the image is illustrated as a three-valued image having gray values that are different in the layers 1 and 2, and the base. However, for example, a 256-gradation grey image having gradation at the boundary of the pattern can be used. The matching data 905 is a gray image in which the pattern 909 of the layer 1 disappears or is of low contrast. The matching data 906 is a gray image in which it is difficult to observe the layer 2, the pattern 910 disappears, and the pattern 911 is of low contrast. The matching data 907 is a gray image produced by changing the gray value of the matching data 904.

Each of the matching data 903 and 906 of FIG. 9 is an example of excluding a pattern or a layer in which a situation where the contrast is low or the grey value is changed to become unstable in some cases is assumed. Alternatively, a weight is set for a specific pattern or each layer in a matching algorithm, so that the low contrast or unstable area is not reflected on the matching (the weight is set at 0 or a very small value), 2.2.4 Proper Degree In the alignment pattern candidate calculating step 107, proper degrees as alignment patterns are evaluated on the basis of the design data, the alignment pattern candidates are determined on the basis of the proper degrees, and the order of the alignment pattern candidates used at the time of alignment is determined on the basis of the proper degrees.

As an example of calculating the proper degrees, circuit patterns in the alignment pattern candidates are characteristic. It is conceivable that the proper degrees are calculated on the basis of such a criterion as whether matching between the template (matching data) and the OM image can be easily performed and whether the matching position is uniquely determined.

In addition, it is conceivable that the proper degrees are calculated on the basis of whether a pattern suitable for matching performed in the matching step 114 is included in an arbitrarily-designated laminated layer group of circuit patterns that can be expected to be observed by the optical microscope. Plural pieces of layer information are included in the design data of the circuit patterns in some cases. However, patterns with the plural pieces of layer information are not necessarily formed on the wafer mounted to the imaging device. Further, it is impossible to observe with the optical microscope in some cases depending on the material of a layer film (for example, an oxide film such as $SiO_2$ is nearly transparent) Accordingly, the laminated layer group of circuit patterns that can be expected to be observed by the optical microscope is designated on the basis of material and film thickness information of each layer or process information such as wafer manufacturing process information. Accordingly, the proper degrees are calculated on the basis of whether a pattern suitable for matching is included in a layer that can be expected to be observed. However, for example, the film thickness is not always uniform in a wafer plane, and the process information is not necessarily provided with accuracy. Further, it is difficult to accurately estimate how the pattern is observed by the optical microscope in some cases. Therefore, the proper degrees are calculated on the basis of whether a pattern suitable for matching is included in each of the all designated laminated layers. Accordingly, even if any one of layers disappears in the OM image, the matching can succeed using a pattern of another layer.

Further, it is conceivable that the proper degrees are calculated in consideration of the symmetry of circuit pattern shapes included in the alignment pattern candidates on the basis of the design data. In the case where it is difficult to perform emulation with the optical microscope with a high degree of accuracy in production of the matching data (template), a difference between the template and the OM image becomes large, and there is a high risk of failure of the matching. However, if the symmetry of the pattern shapes included in the alignment pattern candidates becomes high as described above, the matching can succeed by using a matching algorithm such as matching the centers of gravity of the template (matching data) and the OM image to each other even when the vision of the pattern slightly varies.

Figure 10:
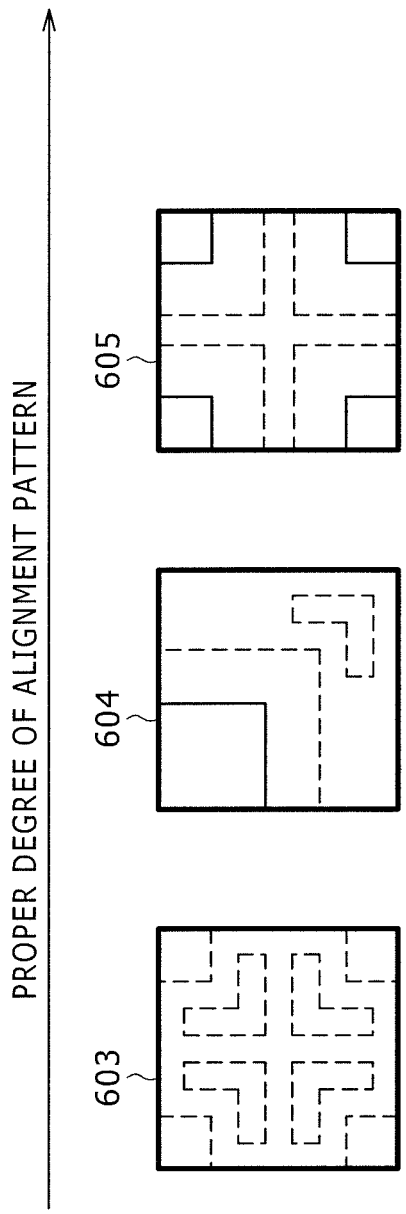
FIG. 10 is a diagram for showing proper degrees of alignment patterns.

The criteria such as whether the pattern is characteristic, whether a pattern of an arbitrary layer is included, and whether the pattern is symmetrical are examples to be considered in calculation of the proper degrees, and the proper degrees can be calculated while appropriately considering other criteria. FIG. 10 shows a result of calculating the proper degrees of the alignment patterns 603 to 605 in FIG. 6B on the basis of the criteria. The alignment pattern 603 includes only the pattern of the layer 1, and the alignment pattern 604 includes the patterns of both of the layers 1 and 2. Therefore, robust matching can be expected in the alignment pattern 604 even if either of the layers disappears. On the other hand, the shape of the alignment pattern 603 is symmetrical in the vertical and horizontal directions, and the alignment pattern 603 is more advantageous than the alignment pattern 604 from the viewpoint of symmetry. However, a higher proper degree is set for the alignment pattern 604 than the alignment pattern 603 in the embodiment because the robustness in the case of disappearance of the layer is especially emphasized. The alignment pattern 605 that includes the patterns of both of the layers 1 and 2 and the pattern shape of which is high in symmetry obtains a higher proper degree than the alignment pattern 604 does.

In addition, the proper degrees can be calculated for not only the alignment pattern candidates, but also the matching data (template). Specifically, in the matching data producing step 108, proper degrees as the matching data are evaluated on the basis of the design data, the matching data is determined on the basis of the proper degrees, and the order of the matching data used at the time of alignment is determined on the basis of the proper degrees. As a method of calculating the proper degrees of the matching data, it is conceivable that the proper degrees are calculated on the basis of similarity to the OM image. Specifically, in order to adapt to possible changes of the OM image, plural pieces of matching data are prepared. A higher proper degree is provided for the matching data to adapt to high frequency of changes.

When determining the alignment pattern candidates and the matching data and calculating the proper degrees thereof in the alignment pattern candidate calculating step 107 and the matching data producing step 108, optical conditions (a wavelength/polarization filter, an imaging magnification, and the amount of illumination) that can be set by the optical microscope 222, a matching algorithm (plural algorithms are available) used in Step 114, and information of the OM image imaged in the past can be used, in addition to the design data and process information (information is input in Steps 104 to 106). Proper emulation can be performed in production of the matching data under the settable optical conditions. Further, variations of the alignment pattern candidates and matching data to be prepared are determined on the basis of variations of the settable optical conditions and the matching algorithm. Further, a determination rule of the proper degrees can be properly set on the basis of the past OM image.

2.2.5 User Presentation and Determination

The alignment pattern candidates and matching data can be presented to a user through a GUI or the like in Step 109, and a user can: (1) select the alignment pattern candidates and matching data to be registered in the imaging recipe; (2) change the proper degrees of the alignment patterns and matching data or change a rule of calculating the proper degrees; and (3) change or designate the settable optical conditions and matching algorithm if needed.

In Step 110, the positions/optical conditions/proper degrees of the alignment pattern candidates, the matching data/proper degrees, and the matching algorithm can be registered in the imaging recipe.

2.2.6 Alignment

Success or failure of the matching performed in Step 114 is determined in Step 115, and the matching with the OM image imaged in Step 113 is repeated until the matching succeeds while changing plural pieces of matching data registered in the imaging recipe, or the matching is performed using the matching data that is most similar to the OM image imaged in Step 113 among the plural pieces of matching data registered in the imaging recipe. Further, when the matching fails even by changing the matching data, the alignment pattern candidates registered in the imaging recipe are changed until the matching succeeds, and the imaging (Step 113) and the matching (Step 114) of the alignment pattern candidates after the change are performed. The alignment pattern candidates are changed together with the imaging with the optical microscope, and thus the matching data is changed in advance.

The alignment pattern candidates and matching data are changed in the order of proper degrees obtained in Steps 107 and 108, so that it can be expected to succeed in the matching the less number of times of matching and imaging. If the matching succeeds, the amount of position shift and the amount of rotation can be calculated in Step 116.

2.2.7 Change of Proper Degree

On the basis of the OM image imaged in the alignment pattern imaging step 113 or success or failure (or the degree of reliability) of the matching in the matching step 114, the value of the proper degree for each alignment pattern candidate or matching pattern, or a rule of calculating the proper degrees can be updated or changed in Step 117.

Since the proper degrees of the alignment pattern candidates and matching patterns calculated in Steps 107 and 108 are estimated values, the values are possibly different from actual values. For example, a layer or pattern that is assumed as visible is actually of low contrast, or patterns that are not present on the design data appear in the actual OM image due to interference by scattered light. When the OM image of the alignment pattern is obtained, the vision of the actual pattern in the OM image can be recognized. The proper degrees can be updated on the basis of the vision. Further, even in the case of alignment patterns having the same pattern on the design data, the OM image that is slightly different can be actually obtained in some cases depending on a position in a wafer plane. In such a case, plural OM images are obtained even in the case of alignment patterns on the same design data, so that variations of vision of the OM image can be known. On the basis of the variations, the proper degrees can be updated. For example, a higher proper degree is set for the alignment pattern candidate in which a region that is changed in vision is located out of the template position. Likewise, the proper degrees can be updated on the basis of success or failure of the actual result of the matching between the alignment pattern candidates and the OM image.

As described above, the OM image imaged in the past or the past matching result are reflected on the proper degrees, so that more accurate proper degrees can be set. In addition, when changing the alignment pattern candidates and matching data in the order of the proper degrees until the matching succeeds in the determination in Step 115, the matching can succeed the less number of times of imaging.

2.2.8 SEM Alignment

Figure 11:
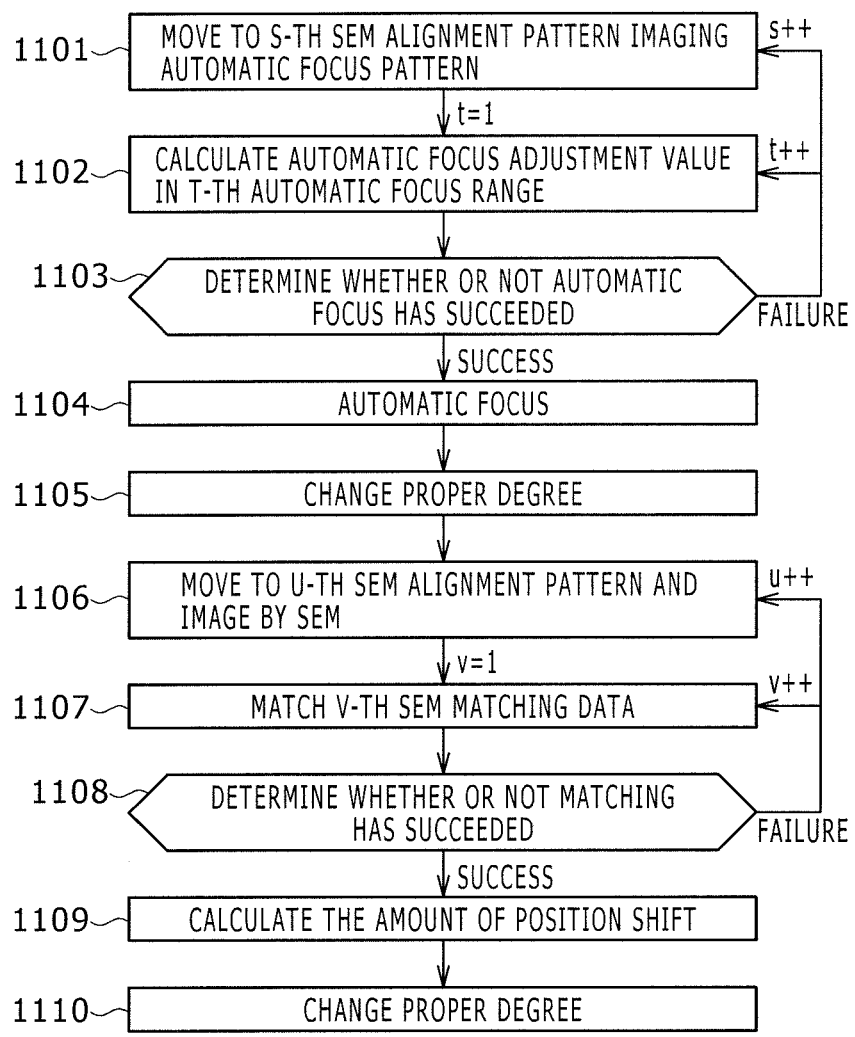
FIG. 11 is a flow diagram of global alignment using the SEM.

After the alignment using the OM image, highly-accurate alignment can be performed using the SEM image in Step 118 (corresponding to Step 403 in FIG. 4A). The determination of the alignment pattern candidates and matching data and the calculation of the proper degrees thereof described in the embodiment are performed for the alignment using the OM image. Using the same means, the alignment pattern candidates and matching data for alignment using the SEM image are determined and the proper degrees thereof are calculated, so to that these can be used in the SEM alignment step 118 (for example, the emulation process simulating the imaging with the optical microscope in production of the matching data is replaced by another simulating the imaging in the SEM). In this case, Step 118 is shown in FIG. 11.

The field of view is moved to the SEM alignment pattern imaging automatic focus pattern in Step 1101, and an automatic focus adjustment value is calculated in the automatic focus range (for example, the entire imaging range) in the focus pattern in Step 1102. If it is determined that the automatic focus has failed in Step 1103, the flow returns to Step 1102 to change the automatic focus range (for example, a part of the imaging range), and the automatic focus adjustment value is calculated again. Alternatively, the flow returns to Step 1101 to change the automatic focus pattern and the field of view is moved. This process is repeated in the order of the proper degrees of the automatic focus patterns and automatic focus ranges. If it is determined that the automatic focus has succeeded in Step 1103, the automatic focus is performed using the automatic focus adjustment value at the time of success (Step 1104). In Step 1105, the values of the proper degrees of the automatic focus patterns and the automatic focus ranges or the rule of calculating the proper degrees can be updated and changed on the basis of the imaged image of the automatic focus position and success or failure of the automatic focus.

The SEM alignment pattern imaging automatic focus pattern, the automatic focus range, and the automatic focus in Steps 1101 to 110 are replaced by the SEM alignment pattern, the matching data (template), and the matching between the template (matching data) and the SEM image, respectively, in Steps 1106 to 1110.

3. System Configuration

An embodiment of a system configuration in the present invention will be described using FIG. 12A and FIG. 12B.

In FIG. 12A, the reference numeral 1201 denotes a mask pattern design device; 1202, a mask drawing device; 1203, an exposing/developing device for a mask pattern on a wafer; 1204, an etching device of a wafer; 1205 and 1207, SEM devices; 1206 and 1208, SEM controlling devices controlling the SEM devices; 1209, an EDA (Electronic Design Automation) tool server; 1210, a database server; 1211, a storage for storing a database; 1212, an imaging/measurement recipe producing/computing device; 1213, an imaging/measurement recipe server; and 1214, an image processing server that measures and evaluates the shape of a pattern. These units can transmit and receive information to/from each other via a network 1215. The storage 1211 is attached to the database server 1210, and can store or refer to a part or all of such following information while being linked to the type, manufacturing process, date and time, and data obtaining device as (a) design data (mask design data (presence/absence of OPC) and wafer transcription pattern design data); (b) produced imaging/measurement recipe; (c) imaged image (OM image or SEM image); (d) imaging/evaluation result (matching result (matching position, success or failure, the degree of reliability) between an OM image and a template of the alignment pattern, the value of a pattern length, the amount of image characteristics, the pattern outline, and the like); and (e) determination rule of an imaging/measurement recipe. Further, two SEM devices 1205 and 1207 are connected to the network 1215 as an example in the drawing. However, the imaging/measurement recipe can be shared by the database server 1210 or the imaging/measurement recipe server 1213 in plural SEM devices. The plural SEM devices can be operated by production of one imaging/measurement recipe. Further, the database (storage) 1211 is shared by the plural SEM devices, so that the imaging in the past or causes of success or failure of measurement can be quickly accumulate. Thus, referring to the information can help produce an excellent imaging/measurement recipe.

FIG. 12B shows an example of integrating the SEM controlling device (A) 1206, the SEM controlling device (B) 1208, the EDA tool server 1209, the database server 1210, the imaging/measurement recipe producing/computing device 1212, the imaging/measurement recipe server 1213, and the image processing server 1214 in FIG. 12A into one device 1216. As in the example, arbitrary functions can be processed while being divided into plural devices or being integrated.

4. GUI

Figure 13:
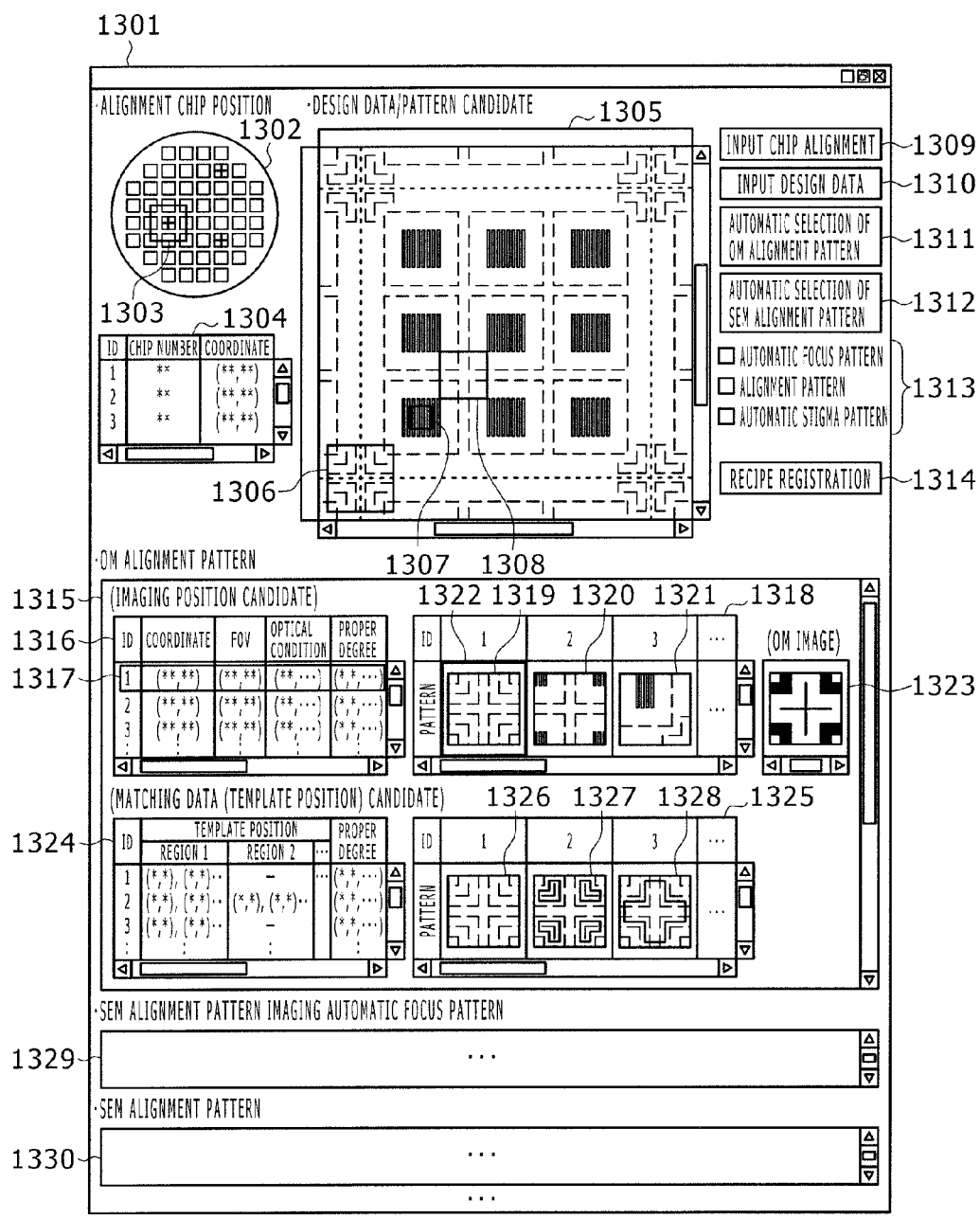
FIG. 13 is a diagram for showing an example of a display screen of a GUI of the imaging device shown in FIG. 1.

FIG. 13 shows an example of a GUI in the embodiment on which various pieces of information are input, production and output of the imaging recipe are set, and the imaging recipe is displayed. Various pieces of information illustrated in a window 1301 of FIG. 13 can be displayed on one screen or can be divided to be displayed on a display. Further, "" in FIG. 13** represents an arbitrary value or a range of a value, or a string of characters input or output to/from the system.

By pressing buttons 1309 and 1310, a chip array and design data of circuit patterns on the wafer can be input. The chip array can be displayed as a drawing, as shown in a map 1302. A chip on which the global alignment is performed can be designated on the map 1302, and a cross mark is given to the designated chip on the map 1302. The numbers and coordinates of the designated chips can be listed as shown in a table 1304. The design data of an area designated on the map 1302 can be displayed in a window 1305. In the example, the design data in an area 1303 (thick frame) designated on the map 1302 is displayed in the window 1305. Since the area 1303 extends across plural chips, the design data combined with the adjacent design data explained using FIG. 5A-FIG. 5C is displayed in the window 1305. The number of times of alignment per chip may be one or more (plural alignment pattern candidates are prepared in both cases of one time and plural times, and the process is performed the desired number of times while changing the plural alignment pattern candidates until the alignment succeeds). Further, it is not necessary to set the alignment pattern candidate on a chip basis, but the alignment pattern candidate extending across plural chips may be set (for example, the alignment pattern candidate 603 in FIG. 63). Further, the alignment pattern candidate may be individually set for each chip (a different alignment pattern can be used depending on a position in a wafer plane even in the case of the same design data).

By pressing buttons 1311 and 1312, the alignment pattern candidates and automatic focus pattern candidates using the optical microscope or the SEM can be automatically selected. In the automatic selection of the alignment patterns using the SEM, it is possible to designate which pattern is automatically selected using check boxes 1313. In the example, an alignment pattern imaging automatic focus pattern and an alignment pattern are checked and selected. An alignment pattern imaging automatic stigma pattern and the like can be automatically selected. Further, a user can manually designate the candidates in the window 1305. The candidates can be displayed in windows 1315, 1329, and 1330, and a user can register the automatic selection to the imaging recipe as it is or by amending the same. A button 1314 is a recipe registering button.

The window 1315 shows a list of alignment pattern candidates using the optical microscope. In a table 1316, displayed are the coordinates of imaging position candidates, FOV, optical conditions, and proper degrees. In a table 1318, displayed is the design data corresponding to the FOV of the imaging position candidates (IDs in the tables 1316 and 1318 correspond to each other). Further, the candidates are selected with a mouse or the like in the tables 1316 and 1318, so that the position on the design data or a corresponding OM image (if previously-imaged data is stored on a database) are displayed, and can be used for various decisions. In the example, the imaging position candidate with the ID No. 1 is selected, and grey frames 1317 and 1322 that indicate being selected are displayed. The position on the design data of the selected imaging position 1319 is displayed as a frame 1306, and the corresponding OM image is displayed in 1323. One OM image is displayed in the example. However, in the case where corresponding plural OM images imaged in the past are present, the images can be displayed while being arranged.

Further, the candidates of the matching data (templates) in the selected imaging position 1319 are displayed in tables 1324 and 1325 (if other imaging position candidates 1320 and 1321 are selected, a list of corresponding matching data candidates is displayed). The template positions (regions used in matching in the FOV) and the proper degrees of the matching data are displayed in the table 1324, and the template positions in the design data of the matching data are displayed in the table 1325 (IDs in the tables 1324 and 1325 correspond to each other). In the drawing, three template position candidates 1326 to 1328 are displayed, and regions used in matching are surrounded by thick frames. The number of regions used in matching is one as the template position 1326 (the entire imaging range is the template position in the example), or 4 as the template position 1327. In the example, three pieces of data 1326 to 1328 with different template positions are displayed as variations of the matching data candidates. However, the matching data candidates with variations such as a difference between design data/image data, the presence or absence of pattern/layer, deformation of the pattern shape, and a difference between grey values due to a difference in emulation as shown in FIG. 9 can be displayed in tables 1324 and 1325.

In addition, a user can add or delete the alignment pattern candidates and matching data candidates displayed in the tables 1316, 1318, 1324, and 1325, or can update various pieces of information (coordinates, optical conditions, proper degrees, and the like). For example, when viewing the OM image 1323, contrast at pattern edges (boundaries between the circuit pattern and the base) is not uniform at the all edges, and a pattern that is not present on the design data is generated in the middle of the FOV. Thus, it is desirable to use a template position that includes edges with a high degree of contrast but does not include the other areas as the matching data candidate 1327. If the proper degree of the matching data candidate 1327 is low, the proper degree of the candidate can be raised on the basis of the information the OM image.

Figure 14A:
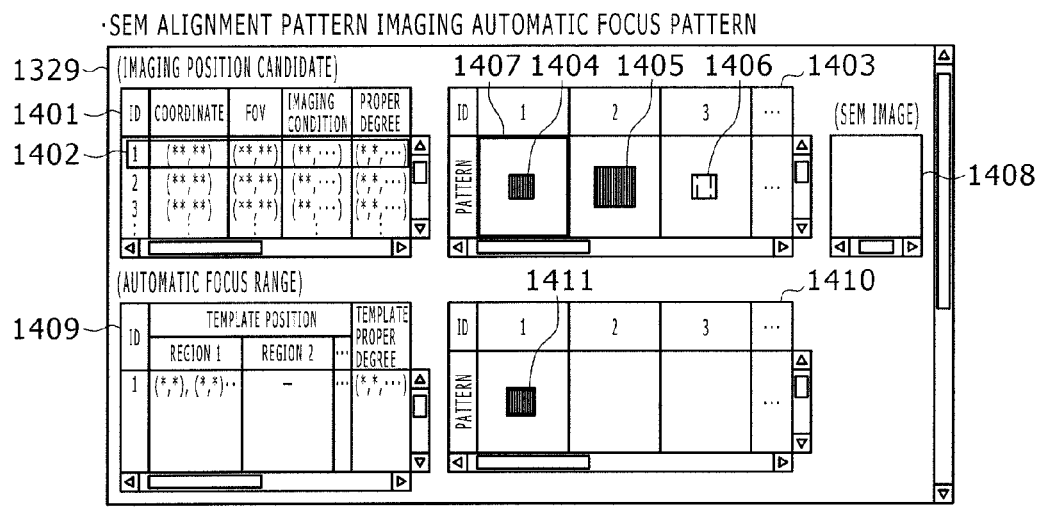
FIG. 14A is a diagram for showing another example of a display screen of a GUI of the imaging device shown in FIG. 1.

A list of the alignment pattern imaging automatic focus pattern candidates and alignment pattern candidates using the SEM can be displayed in each of the windows 1329 and 1330 as similar to the window 1315. The detail of the window 1329 in FIG. 13 is shown in a window 1329 of FIG. 14A. A table 1401 is a list of the alignment pattern candidates using the SEM. The coordinates of the imaging position candidates, the FOV, the imaging conditions of the SEM, and the proper degrees are displayed in the table 1401, and the design data corresponding to the FOV of the imaging position candidate is displayed in a table 1403 (IDs in the tables 1401 and 1403 correspond to each other). Further, the candidates are selected with a mouse or the like in the tables 1401 and 1403, so that the position on the design data or a corresponding SEM image (if previously-imaged data is stored on a database) are displayed, and can be used for various decisions. In the example, the imaging position candidate with the ID No. 1 is selected, and grey frames 1402 and 1407 that indicate being selected are displayed. The position on the design data of the selected imaging position 1404 is displayed as a frame 1307 in FIG. 13, and the corresponding SEM image can be displayed in a window 1408. However, no SEM images imaged in the past exist in the example, and no image is displayed in the window 1408. It should be noted that the reference numerals 1405 and 1406 denote the imaging position candidates. Further, the candidates of the automatic focus ranges in the selected imaging position 1319 are displayed in tables 1409 and 1410. In the example, the number of candidates of the automatic focus ranges in the imaging position candidate 1404 is only one (only an automatic focus range candidate 1411).

Figure 14B:
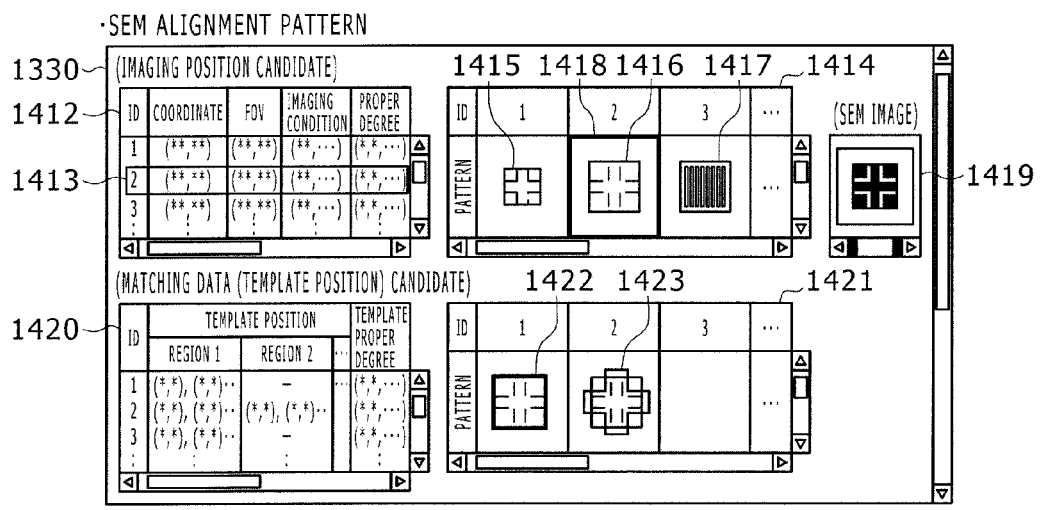
FIG. 14B is a diagram for showing still another example of a display screen of a GUI of the imaging device shown in FIG. 1.

A window 1330 of FIG. 14B displays a list of the alignment pattern candidates using the SEM. The content thereof is the same as those in the windows 1315 and 1329, and thus the explanation thereof is omitted. The position on the design data of the selected imaging position 1416 is displayed as a frame 1308 in FIG. 13. It should be noted that the reference numerals 1412 and 1414 denote imaging position candidate list tables; 1415 and 1417, imaging position candidates; 1413 and 1418, selected imaging position candidates; 1419, an SEM image; 1420 and 1421, matching data candidate list tables; and 1422 and 1423, template position candidates.

In the embodiment, the global alignment can be stably and automatically performed in the imaging device using the above-described means. Accordingly, the accuracy of the imaging position and the automation rate of the imaging device can be improved.

It should be noted that the present invention is not limited to the embodiment, but various modifications may be included. For example, the embodiment has been described in detail to understandably explain the present invention, and is not necessarily limited to one having the all constitutional elements described above. Further, a part of the configuration in one embodiment can be replaced by a configuration of another embodiment, and the configuration in one embodiment can be added to another embodiment. In addition, a part of the configuration in the embodiment can be added to or replaced by another, or deleted.

Further, a part or all of the configurations, functions, processing units, processing means, and the like may be realized by hardware such as designing with an integrated circuit.

Further, the configurations, functions, and the like may be realized by software while a processor interprets and executes programs for realizing the functions. Information of programs, tables, files and the like for realizing the functions can be stored in a recording device such as a memory, a hard disk or an SSD (Solid State Drive), or a recording medium such as an IC card, an SD card, or a DVD.

In addition, control lines and information lines that are believed to be necessary in the explanation are illustrated, and all control lines and information lines are not necessarily illustrated. In fact, almost the all configurations are mutually connected.

DESCRIPTION OF REFERENCE NUMERALS

200 . . . x-y-z coordinate system (coordinate system of electron optical system), 201 . . . semiconductor wafer, 202 . . . electron optical system, 203 . . . electron gun, 204 . . . electron beam (primary electron), 205 . . . condenser lens, 206 . . . deflector, 207 . . . ExB deflector, 208 . . . objective lens, 209 . . . secondary electron detector, 210 and 211 . . . backscattered electron detector, 212 to 214 and 223 . . . A/D converter, 215 . . . processing/controlling unit, 216 . . . CPU, 217 . . . image memory, 218 and 227 . . . processing terminal, 219 . . . stage controller, 220 . . . deflection controlling unit, 221 . . . stage, 222 . . . optical microscope, 224 . . . recipe producing unit, 225 . . . imaging recipe producing device, 226 . . . measurement recipe producing device, 228 . . . database server, 229 . . . database (storage), 230 . . . network, 301 to 306 . . . incident direction of converged electron beam, 307 . . . semiconductor wafer, 308 . . . Ix-Iy coordinate system (image coordinate system), 309 . . . image frame, 416 . . . wafer, 417 to 420 and 421 . . . chip, 422 . . . OM alignment pattern candidate, 423 . . . SEM alignment pattern imaging automatic focus pattern candidate, 424 . . . SEM alignment pattern candidate, 425 . . . partially-enlarged range of design data, 426 . . . MP, 427 . . . image shiftable range from MP, 428 . . . AF, 429 . . . AP, 430 . . . AF, 431 . . . AST, 432 . . . ABCC, 433 . . . EP, 501 . . . wafer, 502 . . . chip, 503 and 504 . . . distance between chips, 505 . . . design data of chip, 506 and 507 . . . range of adjacent chips to be connected, 508 to 515 . . . part of design data, 516 . . . alignment pattern candidate, 601 . . . design data, 602 . . . design data combined with design data of adjacent chips, 603 to 605 . . . alignment pattern candidate, 701 and 704 to 707 . . . template position, 702 and 703 . . . circuit pattern, 801 to 810 . . . alignment pattern candidate, 901 to 907 . . . matching data candidate, 909 to 911 . . . circuit pattern, 1201 . . . mask pattern design device, 1202 . . . mask drawing device, 1203 . . . exposing/developing device, 1204 . . . etching device, 1205 and 1207 . . . SEM device, 1206 and 1208 . . . SEM controlling device, 1209 . . . EDA tool server, 1210 . . . database server, 1211 . . . database (storage), 1212 . . . imaging/measurement recipe producing/computing device, 1213 . . . imaging/measurement recipe server, 1214 . . . image processing server (shape measurement/evaluation), 1215 . . . network, 1216 . . . EDA tool, database management, imaging/measurement recipe producing, image processing (shape measurement/evaluation), imaging/measurement recipe management, SEM controlling integration server and computing device, 1301 . . . GUI window, 1302 . . . map, 1303 . . . selected chip, 1304 . . . selected chip information display list, 1305 . . . design data window, 1306 . . . OM alignment pattern candidate, 1307 . . . SEM alignment pattern imaging automatic focus pattern candidate, 1308 . . . SEM alignment pattern candidate, 1309 . . . chip array input button, 1310 . . . design data input button, 1311 . . . OM alignment pattern automatic selection button, 1312 . . . SEM alignment pattern automatic selection button, 1313 . . . selection pattern selecting check box, 1314 . . . recipe registering button, 1315 . . . OM alignment pattern candidate information list window, 1316 and 1318 . . . imaging position candidate list table, 1317 and 1322 . . . selected imaging position candidate, 1319 to 1321 . . . imaging position candidate, 1323 . . . OM image, 1324 and 1325 . . . matching data candidate list table, 1326 to 1328 . . . template position candidate, 1329 . . . SEM alignment pattern imaging automatic focus pattern candidate information list window, 1330 . . . SEM alignment pattern candidate information list window, 1401 and 1403 . . . imaging position candidate list table, 1402 and 1407 . . . selected imaging position candidate, 1404 to 1406 . . . imaging position candidate, 1408 . . . SEM image display window, 1409 and 1410 . . . automatic focus range candidate list table, 1411 . . . automatic focus range candidate, 1412 and 1414 imaging position candidate list table, 1413 and 1418 . . . selected imaging position candidate, 1415 to 1417 . . . imaging position candidate, 1419 . . . SEM image, 1420 and 1421 . . . matching data candidate list table, 1422 and 1423 . . . template position candidate

The invention claimed is:

1. An imaging method for imaging an image of a circuit pattern formed on a wafer using an imaging device provided with an optical microscope for global alignment, the method comprising:
 a design data inputting step of inputting design data of the circuit pattern;
 an alignment pattern candidate determination step of evaluating degrees as alignment patterns of the wafer on the basis of the design data and determining multiple alignment pattern candidates on the basis of the degrees;
 a matching data producing step of storing the design data corresponding to the alignment patterns determined in the alignment pattern candidate determination step or image data produced from the design data in a recipe as matching data;
 a wafer mounting step of mounting the wafer to the imaging device;
 an imaged image obtaining step of imaging patterns on the wafer corresponding to the alignment pattern candidates determined in the alignment pattern candidate determination step using the optical microscope for global alignment;
 a matching step of matching the matching data produced in the matching data producing step and the imaged image obtained in the imaged image obtaining step to each other; and
 a step of calculating the amount of position shift and/or the amount of rotation of the wafer on the basis of the result in the matching step.

2. The imaging method according to claim 1, wherein a laminated layer group of the circuit patterns that can be expected to be observed by the optical microscope for global alignment is designated, and the degrees of the alignment pattern candidates are calculated on the basis of whether a pattern suitable for matching performed in the matching step is included in the designated arbitrary laminated layer.

3. The imaging method according to claim 1, wherein in the matching data producing step, estimated imaged images that can be obtained when imaging the alignment pattern candidates with the optical microscope for global alignment are emulated in plural ways by a computer on the basis of the design data at the position of the alignment pattern candidate, so that plural pieces of matching data are produced to be stored in the recipe.

4. The imaging method according to claim 3, wherein in the matching step, success or failure of the matching is determined, and the matching with the obtained imaged image is repeated until the matching succeeds while changing the plural pieces of matching data, or the matching is performed using the matching data that is the most similar to the obtained imaged image among the plural pieces of matching data.

5. The imaging method according to claim 1, wherein success or failure of the matching is determined in the matching step, the imaged image obtaining step and the matching step are repeated until the matching succeeds in the matching step, and imaging is sequentially performed in the imaged image obtaining step starting from the alignment pattern candidate with the highest degree obtained in the alignment pattern candidate determination step.

6. The imaging method according to claim 1, wherein on the basis of the obtained imaged image or success or failure of the matching in the matching step, the value of the degree for each alignment pattern candidate is updated.

7. An imaging device provided with an optical microscope for global alignment to image an image of a circuit pattern formed on a wafer, the device comprising:
  design data inputting means that inputs design data of the circuit pattern;
  imaging recipe producing means that evaluates degrees as alignment patterns of the wafer on the basis of the design data and determining multiple alignment pattern candidates on the basis of the degrees, and stores the design data corresponding to the determined alignment pattern candidates or image data produced from the design data in a recipe as matching data;
  wafer mounting means that mounts the wafer to the imaging device;
  imaged image obtaining means that images patterns on the wafer corresponding to the alignment pattern candidates determined by the imaging recipe producing means using the optical microscope for global alignment; and
  matching means that matches the matching data produced by the imaging recipe producing means and the imaged image obtained by the imaged image obtaining means to each other,
  wherein the amount of position shift and the amount of rotation of the wafer are calculated on the basis of the result obtained by the matching means.

* * * * *